United States Patent
Hasegawa

(10) Patent No.: US 6,903,907 B2
(45) Date of Patent: Jun. 7, 2005

(54) MAGNETIC SENSING ELEMENT HAVING SPECULAR LAYER

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 230 days.

(21) Appl. No.: 10/254,283

(22) Filed: Sep. 25, 2002

(65) Prior Publication Data
US 2003/0063416 A1 Apr. 3, 2003

(30) Foreign Application Priority Data
Oct. 1, 2001 (JP) ........................................ 2001-305143

(51) Int. Cl.[7] .............................................. G11B 5/39
(52) U.S. Cl. ................................ 360/324.12; 360/324.1
(58) Field of Search ........................ 360/324.1, 324.11, 360/324.2, 324.12

(56) References Cited

U.S. PATENT DOCUMENTS

| | | | |
|---|---|---|---|
| 6,181,534 B1 | 1/2001 | Gill | 360/324.11 |
| 6,201,673 B1 | 3/2001 | Rottmayer et al. | 360/324.12 |
| 6,219,208 B1 | 4/2001 | Gill | 360/324.1 |
| 6,317,298 B1 * | 11/2001 | Gill | 360/324.11 |
| 6,407,890 B1 * | 6/2002 | Gill | 360/314 |
| 6,466,418 B1 * | 10/2002 | Horng et al. | 360/324.12 |
| 6,556,390 B1 * | 4/2003 | Mao et al. | 360/324.1 |
| 6,587,316 B2 * | 7/2003 | Hasegawa | 360/324.1 |
| 6,591,481 B2 * | 7/2003 | Shimazawa et al. | 29/603.18 |
| 6,654,211 B2 * | 11/2003 | Gill et al. | 360/324.12 |
| 6,717,779 B2 * | 4/2004 | Nagai | 360/324.12 |
| 6,735,060 B2 * | 5/2004 | Gill | 360/324.1 |
| 2001/0012188 A1 * | 8/2001 | Hasegawa et al. | 360/324.12 |
| 2004/0027731 A1 * | 2/2004 | Hasegawa et al. | 360/322 |

FOREIGN PATENT DOCUMENTS

EP    0 845 820 A2    6/1998

* cited by examiner

Primary Examiner—Jefferson Evans
(74) Attorney, Agent, or Firm—Brinks Hofer Gilson & Lione

(57) ABSTRACT

A specular layer and a nonmagnetic layer are provided on a central portion of a free magnetic layer, and ferromagnetic layers and second antiferromagnetic layers are provided on both end portions of the free magnetic layer. In the present invention, the total thickness of the specular layer and the nonmagnetic layer can be decreased, and thus ion milling for removing the layers from both end portions of the free magnetic layer can be performed with low energy. Therefore, both end portions of the free magnetic layer are less damaged by ion milling, and ferromagnetic coupling produced between both end portions of the free magnetic layer and the ferromagnetic layers can be increased, thereby permitting appropriate control of magnetization of the free magnetic layer.

41 Claims, 17 Drawing Sheets

FIG. 9
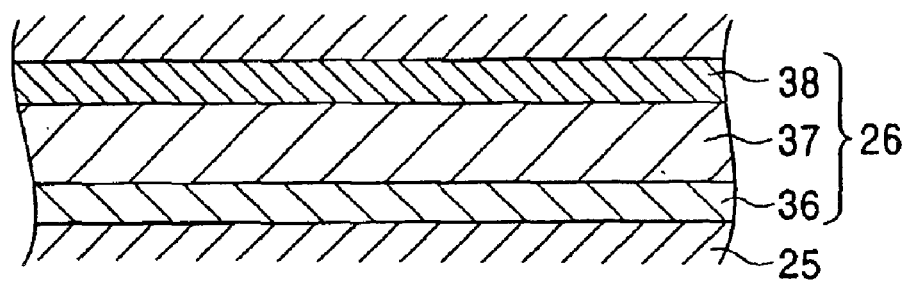
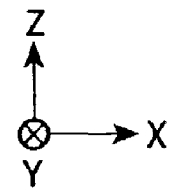
FIG. 10
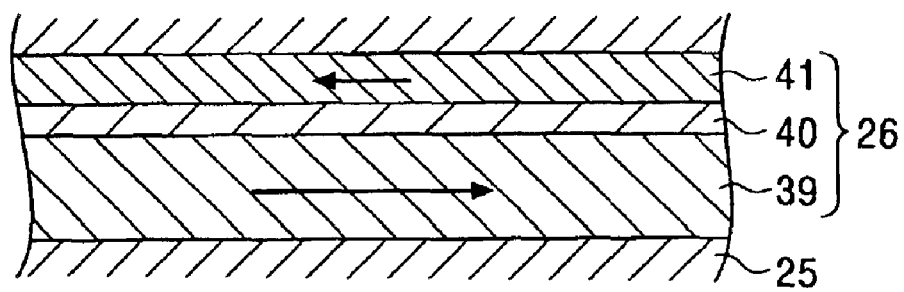
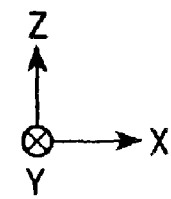

MAGNETIC SENSING ELEMENT HAVING SPECULAR LAYER

This application claims the benefit of priority to Japanese Patent Application 2001-305143, filed on Oct. 1, 2001.

BACKGROUND OF THE INVENTION

1. Field of the Invention

The present invention relates to a magnetic sensing element used for a hard disk device, a magnetic sensor, etc., and particularly to a magnetic sensing element having a specular layer with excellent reproducing characteristics, and permitting proper control of the magnetization of a free magnetic layer even with a narrower track, and a method of manufacturing the magnetic sensing element.

2. Description of the Related Art

In order to appropriately comply with track narrowing with recent increases in recording density, a structure for controlling the magnetization of a free magnetic layer by using a so-called exchange bias system is being the mainstream.

It is also known that when a specular layer (specular reflection layer) comprising a Ta oxide is provided for extending the mean free path λ+ of conduction electrons having, for example, up spin, both the rate (ΔR/R) of change in resistance and reproduced output can be improved.

The above-described magnetic sensing element having the specular layer and using the exchange bias system for controlling magnetization of the free magnetic layer is though to be a desired structure for realizing a higher recording density in future.

The structure of a conventional magnetic sensing element and a manufacturing method therefor will be described below. FIGS. 17 and 18 are drawings respectively showing steps for manufacturing a conventional magnetic sensing element. Each of the figures is a sectional view of the magnetic sensing element taken along the side facing a recording medium.

In the step shown in FIG. 17, an antiferromagnetic layer 2 comprising, for example, a PtMn alloy, is formed on a substrate 1, and a pinned magnetic layer 3 comprising a magnetic material, a nonmagnetic material layer 4 and a free magnetic layer 5 comprising a magnetic material are further laminated on the antiferromagnetic layer 2. Furthermore, a specular layer (specular reflection layer) 9 is formed on the free magnetic layer 5. The specular layer 9 is formed by first depositing a Ta film and then oxidizing the Ta film. The Ta film can easily be oxidized by air exposure.

Next, a lift-off resist layer 10 is formed on the specular layer 9 shown in FIG. 17, and the portions of the specular layer 9, which are exposed on both sides of the resist layer 10 in the track width direction (the X direction shown in the drawing), are completely removed by ion milling. In this step, the free magnetic layer 5 below the specular layer 9 is also partially removed (portions shown by dotted lines).

In the next step shown in FIG. 18, a ferromagnetic layer 11, a second antiferromagnetic layer 12 made of a IrMn alloy, or the like, and an electrode layer 13 are continuously deposited on each of the portions of the free magnetic layer 5, which are exposed on both sides of the resist layer 10. Then, the resist layer 10 shown in FIG. 18 is removed.

In the magnetic sensing element shown in FIG. 18, a track width Tw can be defined by the distance between the ferromagnetic layers 11 in the track width direction (the X direction shown in the drawing), and the ferromagnetic layers 11 are strongly pinned in the X direction by an exchange coupling magnetic field produced between the ferromagnetic layers 11 and the second antiferromagnetic layers 12. Therefore, both end portions A of the free magnetic layer 5, which are respectively positioned below the ferromagnetic layers 11, are strongly pinned in the X direction by ferromagnetic coupling with the ferromagnetic layers 11, and the central portion B of the free magnetic layer 5 in the track width Tw region is possibly put into a single magnetic domain state to a weak level permitting reversal of magnetization with an external magnetic field.

However, the conventional magnetic sensing element formed in the manufacturing steps shown in FIGS. 17 and 18 has the following problems:

(1) First, not only the specular layer 9 but also a portion of the free magnetic layer 5 formed below the specular layer 9 are removed during ion milling in the step shown in FIG. 17, and thus an inert gas such as Ar or the like, that is used for ion milling, easily enters the exposed portions of the free magnetic layer 5 from the surface. Therefore, the crystal structure of the surface portions 5a of the free magnetic layer 5 is broken by damage due to the ion milling, or a crystal defect easily occurs in the structure (Mixing effect). Thus, the magnetic characteristics of the surface portions 5a of the free magnetic layer 5 easily deteriorate.

It is most preferable that only the specular layer 9 can be removed without removal of the free magnetic layer 5. However, it is difficult to actually control such ion milling.

A reason for this lies in the thickness of the specular layer 9 formed on the free magnetic layer 5. As described above, the specular layer 9 is formed by depositing the Ta film, and then oxidizing the Ta film.

In the deposition step, the Ta film conventionally functions as an anti-oxidation layer for protecting the free magnetic layer 5 formed below the Ta film from oxidation, and when the Ta film is formed to an excessively small thickness, therefore, the free magnetic layer 5 cannot be appropriately protected from oxidation.

In the deposition step, the Ta film is formed to a thickness of as large as 10 Å or more, preventing the free magnetic layer 5 formed below the Ta film from being oxidized by air exposure.

However, when the Ta film is oxidized by air exposure, the thickness of the oxidized portion increases to increase the thickness of the specular layer 9 formed by oxidizing the Ta film to be larger than the thickness of the Ta film in the deposition step. As described above, when the Ta film having a thickness of 10 Å or more is formed in the deposition step, the specular layer 9 having a thickness of 20 Å or more is formed.

Therefore, in order to effectively remove both end portions of the specular layer 9 by milling in the step shown in FIG. 17, high-energy ion milling is required. High-energy ion milling has a high milling rate, and it is thus nearly impossible to stop milling at the moment when the thick specular layer 9 is completely removed by ion milling. Namely, as the energy increases, the need to provide a wide margin for a milling stop position increases. Therefore, the free magnetic layer 5 formed below the specular layer 9 is partially removed, and is easily excessively damaged by the high-energy ion milling to significantly deteriorate the magnetic characteristics.

(2) As described above, the surface of the free magnetic layer 5 exposed by ion milling is damaged by the ion milling to deteriorate the magnetic characteristics. Therefore, magnetic coupling (a ferromagnetic exchange interaction) with the ferromagnetic layers 11 laminated on the free magnetic layer 5 is not sufficient, and thus the ferromagnetic layers 11 must be formed to a large thickness.

However, when the ferromagnetic layers 11 are formed to a large thickness, exchange coupling magnetic fields produced between the ferromagnetic layers 11 and the antiferromagnetic layers 12 are weakened, failing to strongly fix magnetizations of both end portions A of the free magnetic layer 5 to produce the problem of side reading, and failing to manufacture a magnetic sensing element capable of complying with track narrowing.

When the ferromagnetic layers 11 are formed to an excessively large thickness, an excessive static magnetic field is easily applied to the central portion B of the free magnetic layer 5 from the inner side plane of each of the ferromagnetic layers 11, thereby easily deteriorating the sensitivity of the central portion B of the free magnetic layer 5 to an external magnetic field, the central portion B permitting reversal of magnetization.

As described above, in the structure of the magnetic sensing element in which the specular layer 9 comprising a Ta oxide is formed on the free magnetic layer 5, and the ferromagnetic layers 11 and the antiferromagnetic layers 12 are laminated on the portions of the free magnetic layer 5, which are exposed by removing both end portions of the specular layer 9, magnetization of the free magnetic layer 5 cannot be appropriately controlled, and a magnetic sensing element capable of complying with a narrower track cannot be manufactured.

SUMMARY OF THE INVENTION

Accordingly, the present invention has been achieved for solving the above problems of the conventional element, and an object of the present invention is to provide a magnetic sensing element comprising a specular layer, and capable of properly controlling the magnetization of a free magnetic layer in an exchange bias system and of appropriately complying with track narrowing, and a method of manufacturing the magnetic sensing element.

In a first aspect of the present invention, a magnetic sensing element comprises a first antiferromagnetic layer, a pinned magnetic layer, a nonmagnetic material layer, and a free magnetic layer, which are laminated in that order from below, a specular layer and a nonmagnetic layer which are provided on a central portion of the free magnetic layer in that order from below, and ferromagnetic layers and second antiferromagnetic layers which are provided, in that order from below, on both end portions of the free magnetic layer in the track width direction.

In the present invention, the thickness of the specular layer provided on the central portion of the free magnetic layer is preferably 3 Å to 10 Å.

In the present invention, the specular layer is preferably made of an oxide or nitride comprising at least one element selected from Ti, Zr, Hf, V, Nb, Ta, Al, Si, Ge, Cr, Mo, W and the rare earth elements. The term "the rare earth elements" is a general term for Sc, Y and the lanthanoide series.

In the present invention, the nonmagnetic layer preferably comprises at least one of Ru, Rh, Pd, Ir, Os, Re, Cr, Cu, Pt, and Au.

In the structure of the magnetic sensing element in the first aspect of the present invention, the nonmagnetic layer is formed on the specular layer formed on the central portion of the free magnetic layer. In this structure, the nonmagnetic layer functions as an antioxidation layer for appropriately protecting the free magnetic layer and the specular layer from oxidation. Therefore, even when the specular layer is thinly formed, a failure of oxidation of the free magnetic layer by air exposure does not occur. Also, the nonmagnetic layer comprises a metal hard to oxidize, thereby causing no problem in which the nonmagnetic layer is oxidized with oxygen diffusing from the specular layer to the nonmagnetic layer, and the specular layer is reduced to lose its specular effect.

In the present invention, the total thickness of the specular layer and the nonmagnetic layer, which are formed on the free magnetic layer, can be decreased, and thus the specular layer and the nonmagnetic layer can be removed from both end portions of the free magnetic layer by low-energy ion milling. Therefore, the damage to the surfaces of both end portions of the free magnetic layer by ion milling can be decreased, as compared with a conventional element.

Therefore, in the present invention, magnetizations of both end portions of the free magnetic layer can be effectively pinned by ferromagnetic coupling produced between the free magnetic layer and the ferromagnetic layers, and the central portion of the free magnetic layer can be weakly put into a single magnetic domain state at a level permitting magnetization reversal with an external magnetic field. It is thus possible to manufacture the magnetic sensing element comprising the specular layer and permitting appropriate control of the magnetization of the free magnetic layer even with a narrower track.

In a second aspect of the present invention, a magnetic sensing element comprises a first antiferromagnetic layer, a pinned magnetic layer, a nonmagnetic material layer, and a free magnetic layer, which are laminated in that order from below, a specular layer provided on a central portion of the free magnetic layer, and a ferromagnetic layer and a second antiferromagnetic layer, which are provided, in that order from below, on each end portion of the free magnetic layer in the track width direction, wherein the thickness of the specular layer provided on the central portion of the free magnetic layer is 3 Å to 15 Å.

In the present invention, the specular layer is preferably made of an oxide or nitride comprising at least one element from Cr, Mo, W, Ti, Si, Ge and Al.

Unlike in the structure of the magnetic sensing element in the first aspect, in the structure of the magnetic sensing element in the second aspect of the present invention, a nonmagnetic layer is not formed on the specular layer formed on the central portion of the free magnetic layer.

In the magnetic sensing element in the second aspect of the present invention, the specular layer itself functions as an antioxidation layer for protecting the free magnetic layer formed below the specular layer from oxidation by air exposure or the like. However, in the present invention, even when the specular layer comprising a Cr oxide or the like is formed to a small thickness of 3 Å to 15 Å, the function as the antioxidation layer can be properly imparted to the specular layer. In this way, in the present invention, the specular layer can be thinly formed, and can thus be removed from both end portions of the free magnetic layer by low-energy ion milling, thereby decreasing the damage to the surfaces of both sides of the free magnetic lay by ion milling, as compared with a conventional sensing element.

Therefore, in the present invention, magnetizations of both end portions of the free magnetic layer can be effectively pinned by ferromagnetic coupling produced between the free magnetic layer and the ferromagnetic layers, and the central portion of the free magnetic layer can be weakly put into a single magnetic domain state at a level permitting magnetization reversal with an external magnetic field. It is thus possible to manufacture the magnetic sensing element comprising the specular layer and permitting appropriate control of magnetization of the free magnetic layer even with a narrower track.

In a third aspect of the present invention, a magnetic sensing element comprises a first antiferromagnetic layer, a pinned magnetic layer, a nonmagnetic material layer, and a free magnetic layer, which are laminated in that order from below, a specular layer provided on a central portion of the free magnetic layer, and a ferromagnetic layer and a second antiferromagnetic layer, which are provided, in that order from below, on each end portion of the free magnetic layer in the track width direction, wherein the specular layer is made of an oxide or nitride comprising at least one element from Cr, Mo, W, Ti, Si, Ge and Al.

In the present invention, the thickness of the specular layer provided on the central portion of the free magnetic layer is 3 Å to 15 Å.

Unlike in the structure of the magnetic sensing element in the first aspect, in the structure of the magnetic sensing element in the third aspect of the present invention, a nonmagnetic layer is not formed on the specular layer formed on the central portion of the free magnetic layer.

In the magnetic sensing element in the third aspect of the present invention, the specular layer itself functions as an antioxidation layer, for protecting the free magnetic layer formed below the specular layer from oxidation by air exposure or the like. However, in the present invention, the specular layer comprises a Cr oxide or the like. Since oxidation of Cr by air exposure slowly proceeds, the free magnetic layer formed below the specular layer can be properly protected from oxidation by the specular layer even when the Cr film is thinly formed.

Therefore, the specular layer comprises Cr oxide or nitride, and thus the function as the antioxidation layer can be imparted to the free magnetic layer even when the specular layer is formed thinly in comparison with a conventional element. Thus, the thin specular layer can be removed from both end portions of the free magnetic layer by low-energy ion milling, thereby decreasing the damage to the surfaces of both end portions of the free magnetic lay by ion milling, as compared with the conventional sensing element.

Therefore, in the present invention, magnetizations of both sides of the free magnetic layer can be effectively pinned by ferromagnetic coupling produced between the free magnetic layer and the ferromagnetic layers, and the central portion of the free magnetic layer can be weakly put into a single magnetic domain state in a level permitting magnetization reversal with an external magnetic field. It is thus possible to manufacture the magnetic sensing element comprising the specular layer and permitting appropriate control of the magnetization of the free magnetic layer even with a narrower track.

In the present invention, the total thickness of the layers formed on the central portion of the free magnetic layer is preferably 20 Å or less. Therefore, the layers formed on each end portion of the free magnetic layer can be properly removed by low-energy ion milling in the step of ion milling the layers, and thus the surface of each end portion of the free magnetic layer can be effectively protected from damage by ion milling.

In the present invention, a backed layer may be formed between the specular layer and the central portion of the free magnetic layer. In this case, the backed layer may be formed on each end portion of the free magnetic layer, and the ferromagnetic layers may be respectively formed on the backed layers on both end portions.

In the present invention, the specular layer may be formed on each end portion of the free magnetic layer, and the ferromagnetic layers may be respectively formed on the specular layers on both end portions.

In the present invention, the thickness of each of the specular layers or the backed layers formed on both end portions is preferably 0.2 Å to 3 Å.

In the present invention, the backed layers or the specular layers are left on both end portions of the free magnetic layer, and thus the surfaces of both end portions of the free magnetic layer are not damaged by ion milling. Therefore, the magnetic properties of both end portions of the free magnetic layer can be maintained good.

In the present invention, the thickness of each of the backed layers or the specular layers formed on both end portions is decreased as much as possible (specifically, 0.2 Å to 3 Å) to produce ferromagnetic coupling between the ferromagnetic layers and both end portions of the free magnetic layer, thereby permitting proper control of the magnetization of the free magnetic layer.

In the present invention, each of the ferromagnetic layers on both end portions of the nonmagnetic layer is preferably formed to a thickness of 2 Å to 50 Å. Therefore, in the present invention, even when the ferromagnetic layers are thinly formed, ferromagnetic coupling can be produced between both end portions of the free magnetic layer and the ferromagnetic layers. In a conventional sensing element, the magnetic properties of both end portions of the free magnetic layer deteriorate due to the influence of ion milling, and thus the thicknesses of the ferromagnetic layers must be increased for maintaining sufficient ferromagnetic coupling with the free magnetic layer. In this case, exchange coupling magnetic fields produced between the ferromagnetic layers and the second antiferromagnetic layers are weakened, and an excessive static magnetic field is easily applied to the central portion of the free magnetic layer from the inner side surface of each of the ferromagnetic layers, thereby causing the problem of deteriorating sensitivity. The present invention can properly suppress this problem.

In the present invention, the free magnetic layer is preferably formed in a structure comprising three magnetic layers. Specifically, the free magnetic layer is preferably formed in a three-layer structure of CoFe/NiFe/CoFe.

A method of manufacturing a magnetic sensing element of the present invention comprises the following steps:

(a) the step of laminating a first antiferromagnetic layer, a pinned magnetic layer, a nonmagnetic intermediate layer, a free magnetic layer, a specular layer and a nonmagnetic layer on a substrate in turn from below;

(b) the step of performing first magnetic field annealing to produce an exchange coupling magnetic field between the first antiferromagnetic layer and the pinned magnetic layer, so that the magnetization of the pinned magnetic layer is pinned in a height direction;

(c) the step of forming a resist layer on a central portion of the nonmagnetic layer;

(d) the step of removing the portions of the nonmagnetic layer and the specular layer, which are exposed from both sides of the resist layer in the track width direction, forming ferromagnetic layers and second antiferromagnetic layers on both exposed portions of the free magnetic layer, and removing the resist layer; and (e) the step of performing second magnetic field annealing to produce exchange coupling magnetic fields between the second antiferromagnetic layers and the ferromagnetic layers, so that magnetization of each end portion of the free magnetic layer is pinned in a direction crossing the magnetization direction of the pinned magnetic layer.

In the present invention, in the step (a), the thickness of the specular layer is preferably 3 Å to 10 Å.

In the present invention, the specular layer is preferably made of an oxide or nitride comprising at least one element selected from Ti, Zr, Hf, V, Nb, Ta, Al, Si, Ge, Cr, Mo, W and the rare earth elements.

In the present invention, the specular layer is preferably formed by forming an element film comprising at least one element of Ti, Zr, Hf, V, Nb, Ta, Al, Si, Ge, Cr, Mo, W and the rare earth elements, and then oxidizing the element film in a vacuum container. As the oxidization method, a method of natural oxidization, radical oxidization, plasma oxidization, or the like can be used.

In the present invention, the nonmagnetic layer preferably comprises at least one of Ru, Rh, Pd, Ir, Os, Re, Cr, Cu, Pt, and Au. The specular layer and the nonmagnetic layer are preferably formed in the vacuum container.

In the present invention, in the step (a), the specular layer and the nonmagnetic layer are formed on the free magnetic layer. In the present invention, the nonmagnetic layer functions as an antioxidation layer for protecting the free magnetic layer (and the specular layer) from oxidization by air exposure, and thus the specular layer can be thinly formed.

As described above, the specular layer is formed by, for example, oxidization or nitriding in the vacuum container, and thus the oxidation or nitriding rate in the vacuum container can be decreased. Therefore, even when the specular layer is formed to a small thickness, there is no defect that oxidization reaches the free magnetic layer formed below the specular layer.

As described above, the nonmagnetic layer comprises, for example, a material hard to oxidize, such as Ru or the like, and even when the nonmagnetic layer is thinly formed like the specular layer, the nonmagnetic layer can thus exhibit the sufficient function as the anti-oxidation layer. Like the specular layer, the nonmagnetic layer is continuously formed in the vacuum container, thereby appropriately protecting the free magnetic layer and the specular layer from oxidation by air exposure.

As described above, in the present invention, the total thickness of the specular layer and the nonmagnetic layer formed on the free magnetic layer can be decreased, and thus the specular layer and the nonmagnetic layer can be removed from both end portions of the free magnetic layer by low-energy ion milling in the step (d).

Therefore, in the step (d), the surfaces of both sides of the free magnetic layer are less damaged by ion milling, and thus the magnetic properties of both sides of the free magnetic layer can be maintained good. Therefore, for example, ferromagnetic coupling between both sides of the free magnetic layer and the ferromagnetic layers can be effectively increased, thereby permitting proper control of magnetization of the free magnetic layer as compared with a conventional sensing element.

Therefore, in the present invention, it is possible to manufacture the magnetic sensing element comprising the specular layer and having good reproduction sensitivity and excellent reproduction properties.

A method of manufacturing a magnetic sensing element of the present invention comprises the following steps:

(f) the step of laminating a first antiferromagnetic layer, a pinned magnetic layer, a nonmagnetic intermediate layer, a free magnetic layer, and a specular layer on a substrate in turn from below, the specular layer being made of an oxide or nitride comprising at least one element selected from Cr, Mo, W, Ti, Si, Ge and Al;

(g) the step of performing first magnetic field annealing to produce an exchange coupling magnetic field between the first antiferromagnetic layer and the pinned magnetic layer, so that the magnetization of the pinned magnetic layer is pinned in a height direction;

(h) the step of forming a resist layer on a central portion of the nonmagnetic layer;

(i) the step of removing the portions of the specular layer, which are exposed from both sides of the resist layer in the track width direction, forming ferromagnetic layers and second antiferromagnetic layers on both exposed portions of the free magnetic layer, and removing the resist layer; and (j) the step of performing second magnetic field annealing to produce exchange coupling magnetic fields between the second antiferromagnetic layers and the ferromagnetic layers, so that the magnetization of each end portion of the free magnetic layer is pinned in a direction crossing the magnetization direction of the pinned magnetic layer.

In the present invention, in the step (f), the thickness of the specular layer is preferably 3 Å to 15 Å.

In the present invention, in the step (f), the specular layer made of a Cr oxide or the like is formed on the free magnetic layer. Since a Cr film is a dense film hard to oxidize by air exposure, and thus even when a Cr thin film is formed in the deposition step, the free magnetic layer formed below the Cr film can be appropriately protected from oxidization by air exposure.

Furthermore, the Cr film or the like can be thinly formed, and even when the specular layer is formed by oxidizing the Cr film, the thickness of the specular layer is not much increased as compared with that in deposition, maintaining the thin specular layer. Therefore, in removing the specular layer from both end portions of the free magnetic layer by ion milling in the step (i), the specular layer can be removed by low-energy ion milling.

Therefore, in the step (i), the surfaces of both sides of the free magnetic layer are less damaged by ion milling, and thus the good magnetic properties of the both sides of the free magnetic layer can be maintained. Consequently, for example, ferromagnetic coupling between both sides of the free magnetic layer and the ferromagnetic layers can be effectively increased to permit proper control of the magnetization of the free magnetic layer, as compared with a conventional sensing element.

Therefore, in the present invention, the magnetic sensing element having the specular layer and exhibiting good reproduction sensitivity and excellent reproduction characteristics even with a narrower track can be manufactured.

In the present invention, in the step (a) or (f), the total thickness of the layers formed on the free magnetic layer is preferably 20 Å or less. Therefore, in the step (d) or (i), the layers on both end portions of the free magnetic layer can be effectively removed even by low-energy ion milling, and the surfaces of both end portions of the free magnetic layer can be protected from damage by ion milling, thereby maintaining the magnetic characteristics of both end portions of the free magnetic layer in a good state.

In the present invention, in the step (a) or (f), a backed layer may be formed on the free magnetic layer, and the specular layer may be formed on the backed layer.

In this case, in the step (d) or (i), the backed layer may be partially left on both sides of the free magnetic layer so that the ferromagnetic layers are formed on the remaining portions of the backed layer.

In the present invention, in the step (d) or (i), the specular layer may be partially left on both sides of the free magnetic layer so that the ferromagnetic layers are formed on the remaining portions of the specular layer.

In the present invention, the thickness of the remaining portions of the backed layer or the specular layer is preferably 0.2 Å to 3 Å.

As described above, when the specular layer or the backed layer is partially left on both end portions of the free magnetic layer, the both end portions of the free magnetic layer formed below the specular layer or the backed layer can be effectively protected from ion milling, thereby maintaining the magnetic characteristics of both sides of the free magnetic layer in a good state. Also, in the present invention, the backed layer or the specular layer is left thinly on both sides, and for example, the ferromagnetic layers and both end portions of the free magnetic layer can thus be effectively ferromagnetically coupled with each other.

In the present invention, in the step (d) or (i), each of the ferromagnetic layers is formed to a thickness of 2 Å to 50 Å.

In the present invention, in the step (a) or (f), the free magnetic layer is preferably form in a structure comprising three magnetic layers. Specifically, the free magnetic layer is preferably formed in the three-layer structure of CoFe/NiFe/CoFe.

BRIEF DESCRIPTION OF THE DRAWINGS

FIG. 9 is an enlarged partial sectional view showing a form of a free magnetic layer of the present invention, taken along the side facing a recording medium;

FIG. 10 is an enlarged partial sectional view showing another form of a free magnetic layer of the present invention, taken along the side facing a recording medium;

DESCRIPTION OF THE PREFERRED EMBODIMENTS

Figure 1:
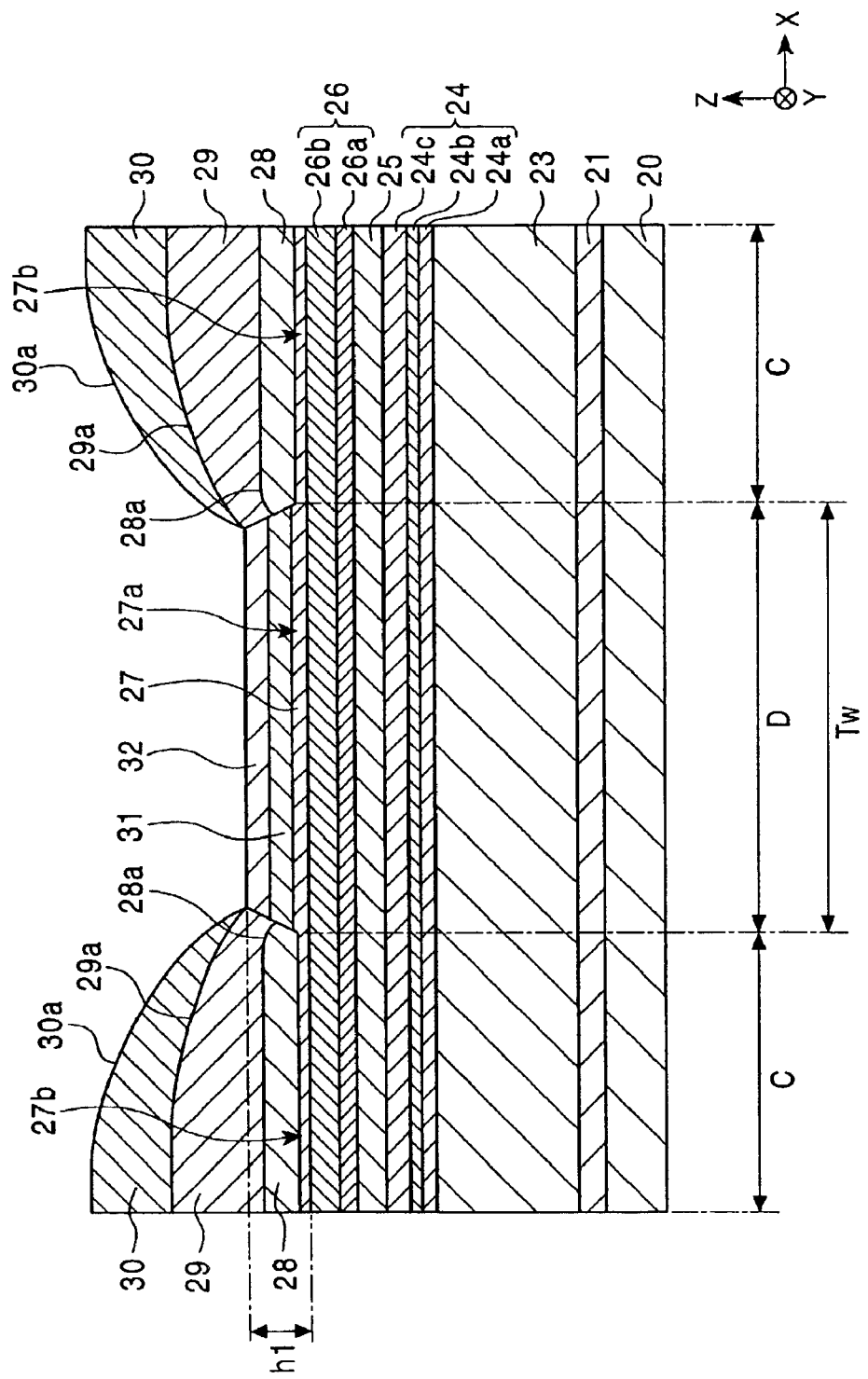
FIG. 1 is a partial sectional view of the structure of a magnetic sensing element according to a first embodiment of the present invention, taken along the side facing a recording medium.

FIG. 1 is a partial sectional view of the structure of a magnetic sensing element (spin-valve thin film element) according to a first embodiment of the present invention, taken along the side facing a recording medium.

The magnetic sensing element shown in FIG. 1 detects a leakage magnetic field from the recording medium such as a hard disk or the like by using a magnetoresistive effect to read record signals.

In FIG. 1, reference numeral 20 denotes a substrate. A seed layer 21 made of a NiFe alloy, a NiFeCr alloy or Cr is formed on the substrate 20. The seed layer 21 is formed to have, for example, the composition $(Ni_{0.8}Fe_{0.2})_{60\ at\ \%}Cr_{40\ at\ \%}$ and a thickness of 60 Å. In the magnetic sensing element, an underlying layer made of Ta may be formed below the seed layer 21 (between the seed layer 21 and the substrate 20).

A first antiferromagnetic layer 23 is formed on the seed layer 21. The first antiferromagnetic layer 23 is made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe and Kr) alloy.

The first antiferromagnetic layer 23 formed by using such an alloy is heat-treated to obtain an exchange coupling film which produces a large exchange coupling magnetic field between the first antiferromagnetic layer 23 and a pinned magnetic layer 24. Particularly, in use of the PtMn alloy, the excellent exchange coupling film having an exchange coupling magnetic field of 48 kA/m or more, for example, over 64 kA/m, between the first antiferromagnetic layer 23 and the pinned magnetic layer 24, and a blocking temperature of as high as 380° C., at which the exchange coupling magnetic field is lost, can be obtained.

Any one of the alloys has a disordered face-centered cubic structure (fcc) immediately after deposition, but the structure is transformed to a CuAuI-type ordered face-centered tetragonal structure (fct) by heat treatment.

The thickness of the first antiferromagnetic layer 23 near the center of the track width direction (the X direction shown in the drawing) is 80 to 300 Å.

As shown in FIG. 1, the pinned magnetic layer 24 is formed on the first antiferromagnetic layer 23. The pinned magnetic layer 24 has a synthetic ferrimagnetic structure. The pinned magnetic layer 24 has a three-layer structure comprising magnetic layers 24a and 24c, and a nonmagnetic intermediate layer 24b provided between the magnetic layers 24a and 24c.

Each of the magnetic layers 24a and 24c is made of a magnetic material, for example, a NiFe alloy, Co, a CoNiFe alloy, a CoFe alloy, a CoNi alloy, or the like. The magnetic layers 24a and 24c are preferably formed by using the same material.

The nonmagnetic intermediate layer 24b is preferably made of an alloy comprising at least one of Ru, Rh, Ir, Cr, Re and Cu. Particularly, the nonmagnetic intermediate layer 24b is preferably made of Ru.

Furthermore, a nonmagnetic material layer 25 is formed on the pinned magnetic layer 24. The nonmagnetic material layer 25 is a layer for preventing magnetic coupling between the pinned magnetic layer 24 and a free magnetic layer 26, and a sensing current mainly flows through the nonmagnetic material layer 25. The nonmagnetic material layer 25 is preferably made of a conductive nonmagnetic material such as Cu, Cr, Au, Ag, or the like, and more preferably made of Cu.

Furthermore, the free magnetic layer 26 is formed on the nonmagnetic material layer 25. In the embodiment shown in FIG. 1, the free magnetic layer 26 has a two-layer structure. A layer denoted by reference numeral 26a is an anti-diffusion layer comprising Co or CoFe. Furthermore, a magnetic material layer 26b made of a NiFe alloy or the like is formed on the anti-diffusion layer 26a.

A backed layer 27 made of Cu or the like is formed on the free magnetic layer 26. The backed layer 27 is formed over the entire surface of the free magnetic layer 26. However, in this embodiment, the thickness of the central portion 27a of the backed layer 27 is larger than the thickness of each of both end portions 27b of the backed layer 27, which are formed on both end portions C of the free magnetic layer 26.

Furthermore, ferromagnetic layers 28 are respectively formed on both end portions 27b of the backed layer 27, and second antiferromagnetic layers 29 are respectively formed on the ferromagnetic layers 28. Like the first antiferromagnetic layer 23, each of the second antiferromagnetic layers 29 is made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe and Kr) alloy.

Furthermore, electrode layers 30 are respectively formed on the second antiferromagnetic layers 29. Each of the electrode layers 30 is made of, for example, Au, W, Cr, Ru, Rh, or Ta.

As shown in FIG. 1, a specular layer 31 is formed on the central portion 27a of the backed layer 27, and a nonmagnetic layer 32 is further formed on the specular layer 31.

In the embodiment shown in FIG. 1, the upper surfaces 28a of the ferromagnetic layers 28, the upper surfaces 29a of the second antiferromagnetic layers 29, and the upper surfaces 30a of the electrode layers 30 are inclined or curved surfaces so that the distance between both surfaces gradually increases in the direction (the Z direction shown in the drawing) from the lower side to the upper side.

The structural characteristics of the magnetic sensing element shown in FIG. 1 are described below.

The function of the specular layer 31 shown in FIG. 1 is first described. In the present invention, the specular layer (also referred to as the "specular reflection layer") 31 comprises, for example, an oxide or nitride of Cr or the like. When the specular layer 31 is formed above the free magnetic layer 26, conduction electrons (for example, up-spin conduction electrons) reaching the specular layer 31 are specular-reflected by the specular layer 31 while maintaining their spin states (energy, quantum state, etc.). The up-spin conduction electrons specular-reflected are changed in the motion direction so that they can pass through the free magnetic layer.

Therefore, in the present invention, the mean free path $\lambda+$ of up-spin conduction electrons can be extended by providing the specular layer 31, as compared with a conventional path, thereby increasing the difference between the mean free path $\lambda+$ of up-spin conduction electrons and the mean free path $\lambda-$ of down-spin conduction electrons. It is thus possible to improve the rate ($\Delta R/R$) of change in resistance, and reproduced output.

Next, the material of the specular layer 31 is described below. In the present invention, the specular layer 31 is preferably made of an oxide or nitride comprising at least one of Ti, Zr, Hf, V, Nb, Ta, Al, Si, Ge, Cr, Mo, W and the rare earth elements. The term "the rare earth elements" is a general term for Sc, Y and the lanthanoide series. The specular layer 31 made of an oxide or nitride of at least one element selected from the above elements can appropriately exhibit the specular effect.

In the present invention, the thickness of the specular layer 31 can be decreased, as compared with a conventional example. In the present invention, the specular layer 31 is preferably formed to a thickness of 3 Å to 10 Å on the central portion D of the free magnetic layer 26. In the present invention, the first reason why the specular layer 31 can be formed to such a small thickness lies in the point that the material and the treatment method (oxidization method or nitriding method) of the specular layer 31 are optimized, and the second reason lies in point that the nonmagnetic layer 32 is formed on the specular layer 31.

The specular layer 31 is made of an oxide or nitride comprising at least one of Ti, Zr, Hf, V, Nb, Ta, Al, Si, Ge, Cr, Mo, W and the rare earth elements. However, in the present invention, the specular layer 31 is formed by, for example, forming an element thin film of about 1 to 5 Å comprising at least one of Ti, Zr, Hf, V, Nb, Ta, Al, Si, Ge, Cr, Mo, W and the rare earth elements in the deposition step, and then oxidizing or nitriding the element film at low pressure in a vacuum chamber. As the oxidization method, natural oxidation, radical oxidation or plasma oxidation can be selected.

When the element film is oxidized or nitrided at low temperature, the oxidization rate or nitriding rate can be decreased, and even when the specular layer 31 is thinly formed, oxidation or nitriding can be prevented from reaching the backed layer 27 and the free magnetic layer 26, which are formed below the specular layer 31.

Although the thickness of the specular layer 31 formed by oxidizing or nitriding the element film is increased to be larger than the element film, the specular layer 31 is formed to a thickness of only 3 Å to 10 Å even by oxidization or nitriding because the element film has a thickness of as small as about 1 Å to 5 Å.

In the present invention, the material and the treatment method of the specular layer 31 are optimized so that oxidization or nitriding of the backed layer 27 and the free magnetic layer 26 formed below the specular layer 31 can be appropriately prevented even when the specular layer 31 is formed to a thickness of as small as 3 Å to 10 Å.

As described above, the second reason why the specular layer 31 can be thinly formed lies in the point that the nonmagnetic layer 32 is formed on the specular layer 31. In the present invention, the nonmagnetic layer 32 preferably comprises at least one of Ru, Rh, Pd, Ir, Os, Re, Cr, Cu, Pt and Au.

The nonmagnetic layer 32 comprising Ru is a dense film hard to oxidize by air exposure, and thus the specular layer 31 formed below the nonmagnetic layer 32, and the backed layer 27 and the free magnetic layer 26 formed below the specular layer 31 are appropriately protected from oxidization by the nonmagnetic layer 32.

A conventional specular layer 31 comprising a Ta oxide also functions as an anti-oxidization layer for protecting a free magnetic layer, which is formed below the specular layer 31, from oxidization, and thus the specular layer 31 must be formed to a thickness of as large as 20 Å or more. In the present invention, however, the nonmagnetic layer 32 is formed on the specular layer 31 to charge the nonmagnetic layer 32 with the function as the anti-oxidization layer. Consequently, even when the thickness of the specular layer 31 is decreased, each of the backed layer 27 and the free magnetic layer 26 formed below the specular layer 31 can be appropriately protected from oxidization by air exposure.

The nonmagnetic layer 32 made of Ru or the like as described above is a dense film hard to oxidize, and thus even when the nonmagnetic layer 32 is formed to a small thickness in the present invention, the specular layer 31, etc. formed below the nonmagnetic layer 32 can be appropriately protected from oxidization. There is also no problem in which oxygen contained in the specular layer 31 diffuses to the nonmagnetic layer 32 to oxidize the nonmagnetic layer 32 in the annealing step, and the specular layer is reduced to lose its specular effect.

In the present invention, the nonmagnetic layer 32 is preferably formed to a thickness of 2 Å to 8 Å. With the nonmagnetic layer 32 having a thickness of less than 2 Å, each of the layers formed below the nonmagnetic layer 32 cannot be effectively protected from oxidization. With the nonmagnetic layer 32 having a thickness of over 8 Å, the backed layer 27, the specular layer 31 and the nonmagnetic layer 32 are formed to a total thickness h1 of 20 Å or more on each of both end portions C of the free magnetic layer 26 in the deposition step. Therefore, both end portions C of the free magnetic layer 26 are easily affected by ion milling to undesirably deteriorate the magnetic characteristics of both end portions of the free magnetic layer 26.

In the manufacturing method described below, like the specular layer 31, the nonmagnetic layer 32 is preferably continuously formed in a vacuum container.

As described above, the specular layer 31 is formed by oxidization or nitriding under low pressure, and the nonmagnetic layer 32 is formed on the specular layer 31, so that the specular layer can be formed to a small thickness. In the present invention, for example, Ta which is conventionally used can be used as the material for the specular layer 31.

In the present invention, a Ta film is formed to a thickness of as small as 1 Å to 5 Å in the deposition step. The Ta film is easily oxidized by air exposure, and with such a Ta thin film, the free magnetic layer 26 formed below the Ta film is easily affected by oxidization. Therefore, the Ta film is oxidized or nitrided under low pressure in the vacuum container. In this case, the rate of oxidization or nitriding under low pressure is lower than that in the air, and thus only the Ta thin film of 1 Å to 5 Å can be appropriately oxidized or nitrided while preventing the influence of oxidization or nitriding on the free magnetic layer 26 and the backed layer 27 formed below the Ta film.

In the present invention, next, the nonmagnetic layer 32 made of Ru or the like is continuously formed on the specular layer 31 comprising an oxide or nitride of the Ta film without being exposed to the air so that the specular layer 31 is appropriately protected from oxidization by air exposure. Without the nonmagnetic layer 32, oxidization of the specular layer 31 comprising an oxide or nitride of the Ta film significantly proceeds, and thus the free magnetic layer 26 and the backed layer 27 formed below the specular layer 31 are affected by oxidization.

When the specular layer 31 is formed by using an oxide or nitride of a material, for example, Cr, Mo, W, Ti, Si, Ge or Al, in which oxidization less proceeds by air exposure as compared with Ta, even with a thin Cr film or the like, the free magnetic layer 26 and the backed layer 27 formed below the specular layer 31 can be appropriately prevented from being oxidized by air exposure. Therefore, the Cr film or the like may be oxidized in the air without using the low-pressure oxidization method.

Next, the backed layer 27 is described below.

By forming the backed layer 27, the mean free path of up-spin conduction electrons which contribute to the magnetoresistive effect can be extended, and a high rate of change in resistance can be obtained by a spin filter effect in the magnetic sensing element, thereby making the magnetic sensing element adaptable to a higher recording density.

The backed layer 27 comprises, for example, Cu, Ag, Au, Ru, or the like. The thickness of the central portion 27a of the backed layer 27 is preferably 2 Å to 5 Å. Therefore, the spin filter effect can be exhibited, and the influence of ion milling on both end portions C of the free magnetic layer 26 can be decreased.

In the embodiment shown in FIG. 1, the thickness of each of both end portions 27b of the backed layer 27 is smaller than the central portion 27a. However, if the thickness of the central portion 27a of the backed layer 27 is as small as 3 Å or less, the thickness of each of both end portions 27b of the backed layer 27 may be the same as the central portion 27a.

Next, the total thickness of the layers formed on the central portion D of the free magnetic layer 26 is described below.

In the embodiment shown in FIG. 1, the backed layer 27, the specular layer 31 and the nonmagnetic layer 32 are formed on the central portion D of the free magnetic layer 26. In the present invention, the total thickness h1 of these layers formed on the central portion D of the free magnetic layer 26 is preferably 7 Å to 20 Å. The reason for setting the minimum of the total thickness h1 to 7 Å is that the minimum thickness of the backed layer 27 is 2 Å, the minimum thickness of the specular layer 31 is 3 Å, and the minimum thickness of the nonmagnetic layer 32 is 2 Å.

In the present invention, when the total thickness of the layers formed on the central portion D of the free magnetic layer 26 is 20 Å or less, each of the layers formed on each end portion C of the free magnetic layer 26 can be removed by low-energy ion milling in the ion milling step. The low-energy milling rate is lower than that in high-energy milling, and thus milling can be relatively easily controlled to be stopped in a stage in which both end portions 27b of the backed layer 27 are slightly left, as shown in FIG. 1.

In the embodiment shown in FIG. 1, both end portions 27b of the backed layer 27 are partially left on both sides C of the free magnetic layer 26, and the ferromagnetic layers 28 are formed on both end portions 27b. Namely, in FIG. 1, both end portions 27b of the backed layer 27 are interposed between both end portions C of the free magnetic layer 26 and the ferromagnetic layers 28. However, both end portions 27b of the backed layer 27 are preferably formed to a thickness of as small as 0.2 Å to 3 Å. The thickness "0.2 Å" is the average over the whole of both end portions 27b of the backed layer 27. The thickness of 0.2 Å is smaller than the thickness of an atomic layer, and thus in both end portions 27b, a portion having the constituent atoms of the backed layer 27 and a portion without the constituent atoms are islanded. Therefore, the thickness "0.2 Å" is the average over the whole of both end portions 27b of the backed layer 27.

As described above, each of both end portions 27b of the backed layer 27 is formed to a thickness of as small as 0.2 Å to 3 Å, so that ferromagnetic coupling occurs between both end portions C of the free magnetic layer 26 and the ferromagnetic layers 28. The ferromagnetic layers 28 are strongly put into a single magnetic domain state in the track width direction (the X direction) by exchange coupling magnetic fields produced between the ferromagnetic layers 28 and the second antiferromagnetic layers 29 respectively formed thereon. As a result, both end portions C of the free magnetic layer 26 on which ferromagnetic coupling with the ferromagnetic layers 28 is exerted are also oriented in the same direction as the magnetization directions of the ferromagnetic layers 28, and strongly put into a single magnetic domain state in the track width direction (the X direction).

The term "ferromagnetic coupling" represents that the magnetization of each of both end portions C of the free magnetic layer 26 is oriented in the same direction as the magnetization directions of the ferromagnetic layers 28 by RKKY ferromagnetic coupling between both end portions C of the free magnetic layer 26 and the ferromagnetic layers 28 through both end portions 27b of the backed layer 27, or a direct exchange interaction through defects such as pin holes or the like, which are formed in both end portions 27b of the backed layer 27.

The constituent element of both end portions 27b of the backed layer 27 thermally diffuses by annealing in a magnetic field for producing exchange coupling magnetic fields between the ferromagnetic layers 28 and the second antiferromagnetic layers 29. For example, when each of the ferromagnetic layers 28 and the free magnetic layer 26 comprises a NiFe alloy, and the backed layer 27 comprises Cu, and particularly, when both end portions 27b of the backed layer 27 are formed to a very small thickness, both end portions 27b of the backed layer 27 disappear by the thermal diffusion, and a NiFeCu alloy layer is formed on each of the backed layer side surfaces of the free magnetic layer and the ferromagnetic layers 28. Therefore, both end portions C of the free magnetic layer 26 and the ferromagnetic layers 28 function as an integrated ferromagnetic layer.

Therefore, when the magnetizations of the ferromagnetic layers 28 are pinned in the track width direction (the X direction) by the exchange coupling magnetic fields produced between the ferromagnetic layers 28 and the antiferromagnetic layers 29, both end portions C of the free magnetic layer 26 are oriented in the same direction as the magnetization directions of the ferromagnetic layers 28, and strongly put into the single magnetic domain state in the track width direction (the X direction).

In the present invention, each of the ferromagnetic layers 28 is preferably formed to a thickness of 2 Å to 50 Å.

In the present invention, even when the ferromagnetic layers 28 are thinly formed, the ferromagnetic coupling can be effectively produced between the ferromagnetic layers 28 and both end portions C of the free magnetic layer 26. This is because both end portions C of the free magnetic layer 26 maintain the proper magnetic properties without being affected by ion milling. When each of the ferromagnetic layers 28 is formed to the above-described small thickness, large exchange coupling magnetic fields can be produced between the ferromagnetic layers 28 and the second antiferromagnetic layers 29. Furthermore, it is possible to appropriately suppress a problem in which an excessive static magnetic field from the inner side face of each of the ferromagnetic layers 28 affects the central portion D of the free magnetic layer 26, deteriorating the sensitivity of the free magnetic layer 26.

As described above, in the embodiment shown in FIG. 1, the magnetization of each end portion C of the free magnetic layer 26 is appropriately fixed in the track width direction (the X direction).

On the other hand, the magnetization of the central portion D of the free magnetic layer 26 is weakly put into the single magnetic domain state in a level permitting reversal of magnetization. The width dimension of the central portion D in the track width direction (the X direction) substantially coincides with the track width Tw defined by the distance between the lower surfaces of the ferromagnetic layers 28 in the track width direction (the X direction). Therefore, even when narrowing of the track progresses with increases in the recording density, the region of the track width Tw can be properly defined as a sensitive region permitting reversal of magnetization, and the magnetic sensing element having the specular layer 31 and capable of appropriately complying with a higher recording density can be manufactured. The track width is preferably 0.2 µm or less.

Figure 2:
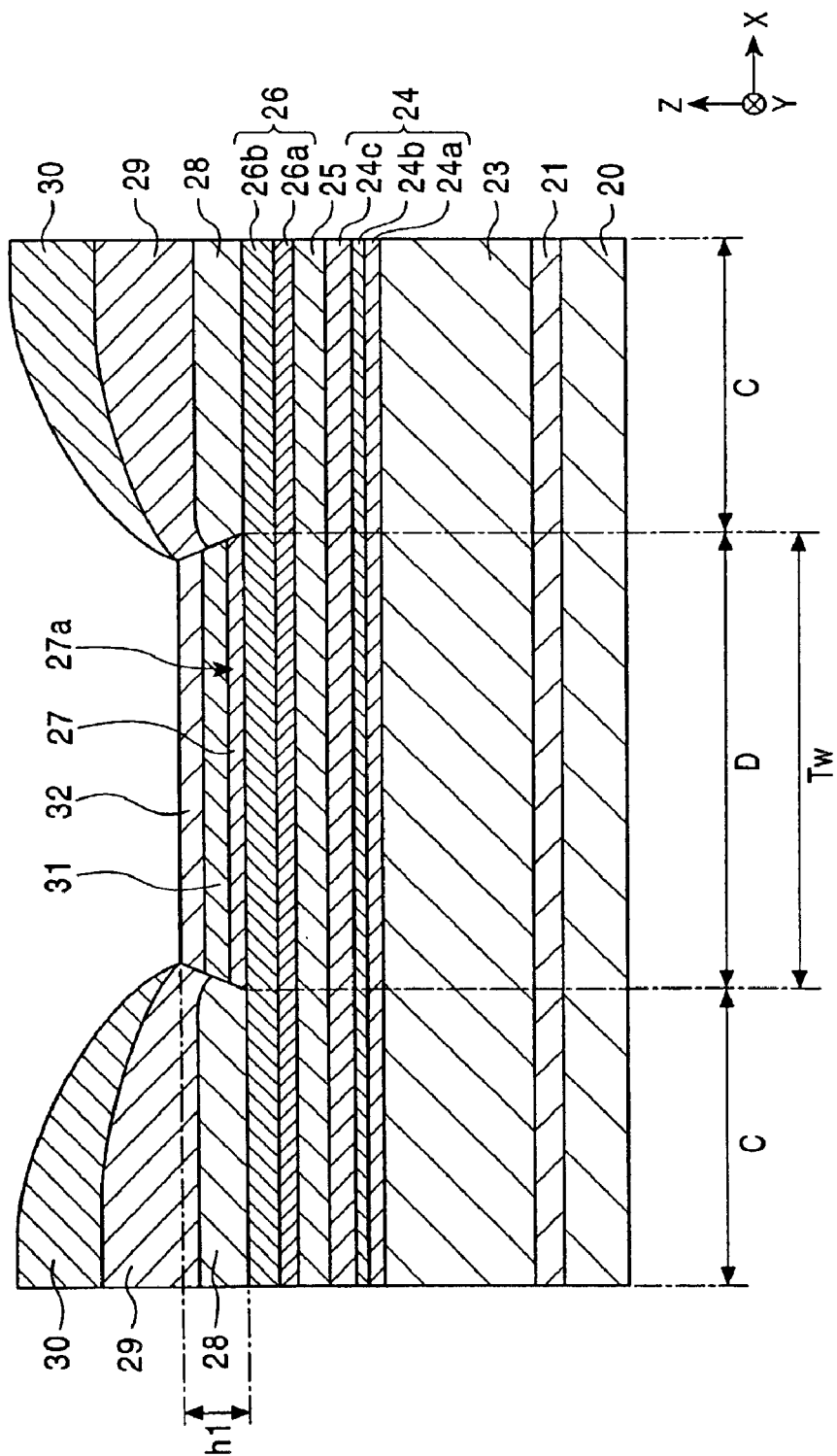
FIG. 2 is a partial sectional view of the structure of a magnetic sensing element according to a second embodiment of the present invention, taken along the side facing a recording medium.

FIG. 2 is a partial sectional view of the structure of a magnetic sensing element according to a second embodiment of the present invention, as viewed from the side facing a recording medium.

In the embodiment shown in FIG. 2, the forms of layers are the same as the embodiment shown in FIG. 1 except the backed layer 27. Therefore, the form of the backed layer 27 is mainly described below.

In FIG. 2, the backed layer 27 is formed only on the central portion D of a free magnetic layer 26, without being formed on both end portions C of the free magnetic layer 26. As described above with reference to FIG. 1, the total thickness h1 of the backed layer 27, the specular layer 31 and the nonmagnetic layer 32, which are formed on the free magnetic layer 26, is 7 Å to 20 Å.

Therefore, in the present invention, in the step of removing the backed layer 27, the specular layer 31 and the nonmagnetic layer 32 from both end portions C of the free magnetic layer 26, only the backed layer 27, the specular layer 31 and the nonmagnetic layer 32 can be appropriately removed even by low-energy ion milling.

Namely, in the present invention, low-energy ion milling can be used, and thus the milling rate can be decreased to be lower than that of high-energy milling to permit the removal of only the backed layer 27, the specular layer 31 and the nonmagnetic layer 32. Therefore, milling can be properly controlled to minimize damage to both end portions C of the free magnetic layer 26 by ion milling.

Therefore, in the embodiment shown in FIG. 2, both end portions C of the free magnetic layer 26 are less damaged by ion milling, and thus the magnetic properties of both end portions C of the free magnetic layer 26 can be maintained in a good state. Furthermore, the ferromagnetic layers 28 and the second antiferromagnetic layers 29 are formed on both end portions C of the free magnetic layer 26, and the magnetizations of the ferromagnetic layers 28 are strongly pinned in the track width direction by exchange coupling magnetic fields between the ferromagnetic layers 28 and the antiferromagnetic layers 29. As a result, the magnetizations of both end portions C of the free magnetic layer 26 ferromagnetically coupled with the ferromagnetic layers 28 can be strongly put into the single magnetic domain state in the track width direction.

Therefore, in the present invention, even with a narrower tack, the magnetization of the free magnetic layer 26 can be effectively controlled, and the magnetic sensing element having the specular layer 31 and excellent for a higher recording density can be manufactured.

In the embodiment shown in FIG. 2, the materials and the thicknesses of the other layers are the same as the embodiment shown in FIG. 1 except the backed layer. Thus, a detailed description of the other layers is omitted (refer to FIG. 1).

Figure 3:
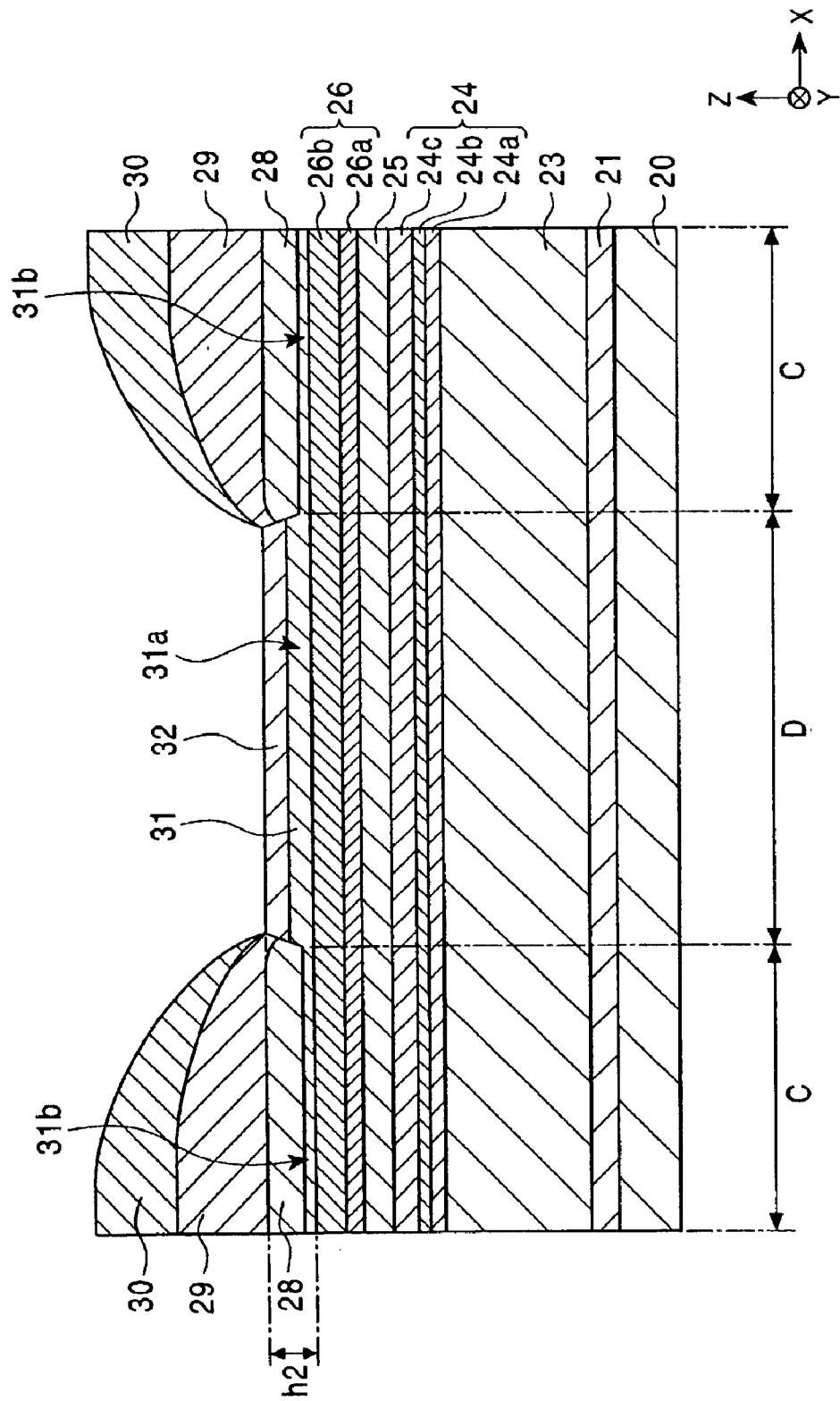
FIG. 3 is a partial sectional view of the structure of a magnetic sensing element according to a third embodiment of the present invention, taken along the side facing a recording medium.

FIG. 3 is a partial sectional view of the structure of a magnetic sensing element according to a third embodiment of the present invention, as viewed from the side facing a recording medium.

The embodiment shown in FIG. 3 is different from the embodiments shown in FIGS. 1 and 2 in that the backed layer 27 is not formed on the free magnetic layer 26. In FIG. 3, the specular layer 31 and the nonmagnetic layer 32 are formed on the free magnetic layer 26.

In the embodiment shown in FIG. 3, the thickness of the central portion 31a of the specular layer 31 is larger than that of its each end portion 31b.

As described above with reference to FIG. 1, the specular layer 31 is preferably made of an oxide or nitride comprising at least one of Ti, Zr, Hf, V, Nb, Ta, Al, Si, Ge, Cr, Mo, W and the rare earth elements.

The thickness of the central portion 31a of the specular layer 31 is preferably 3 Å to 10 Å.

The nonmagnetic layer 32 preferably comprises at least one of Ru, Rh, Pd, Ir, Os, Re, Cr, Cu, Pt, and Au. The thickness of the nonmagnetic layer 32 is preferably 2 Å to 8 Å.

In the present invention, the nonmagnetic layer 32 is formed as an anti-oxidation layer on the specular layer 31, so that even with the specular layer 31 having a thickness of as small as 3 Å to 10 Å, the specular layer 31 and the free magnetic layer 26 can be appropriately protected from oxidization by air exposure. When the nonmagnetic layer 32 comprises a dense film of Ru or the like, which is hard to oxidize, even with the nonmagnetic layer 32 having a thickness of as small as 2 Å to 8 Å, the specular layer 31 and the free magnetic layer 26 can be appropriately protected from oxidization by air exposure. Therefore, in the present invention, the total thickness h2 of the specular layer 31 and the nonmagnetic layer 32 formed on the central portion D of the free magnetic layer 26 can be decreased. In the present invention, the total thickness h2 is preferably 5 Å to 20 Å. The reason for setting the minimum of the total thickness h2 to 5 Å is that the minimum thickness of the specular layer is 3 Å, and the minimum thickness of the nonmagnetic layer 32 is 2 Å.

In this way, when the total thickness h2 of the specular layer 31 and the nonmagnetic layer 32 formed on the central portion D of the free magnetic layer 26 is 20 Å or less, the specular layer 31 and the nonmagnetic layer 32 can be removed from both end portions C of the free magnetic layer 26 by using low-energy ion milling in the ion milling step after deposition of the specular layer 31 and the nonmagnetic layer 32. Thus, the ion milling can easily be controlled to stop at a predetermined position.

In the embodiment shown in FIG. 3, both end portions 31b of the specular layer 31 are left on both end portions C of the free magnetic layer 26. However, the thickness of each of both end portions 31b of the specular layer 31 is as small as 0.2 Å (the average over the whole of both end portions 31b) to 3 Å. When such thin ends 31b of the specular layer 31 are left, ferromagnetic coupling can be property produced between both end portions C of the free magnetic layer 26 and the ferromagnetic layers 28, both end portions C respectively facing the ferromagnetic layers 28 with both end portions 31b of the specular layer 31 provided therebetween. Alternatively, both end portions C of the free magnetic layer 26 and the ferromagnetic layers 28 can be caused to function as an integrated ferromagnetic layer, and both end portions C of the free magnetic layer 26 can be effectively put into the single magnetic domain state in the track width direction (the X direction).

On the other hand, the central portion D of the free magnetic layer 26 is weakly put into the single magnetic domain state in a level permitting reversal of magnetization with an external magnetic field.

In the embodiment shown in FIG. 3, it is possible to manufacture the magnetic sensing element having the specular layer 31 and capable of effectively controlling the magnetization of the free magnetic layer 26 even when the track is narrowed in future.

When the thickness of the central portion 31a of the specular layer 31 formed on the central portion D of the free magnetic layer 26 is as small as 3 Å or less, the thickness of the central portion 31a may be the same as the thicknesses of both end portions 31b.

A description of the thicknesses and the material of layers not described above with reference to FIG. 3 are described above with reference to FIG. 1 (refer to FIG. 1).

Figure 4:
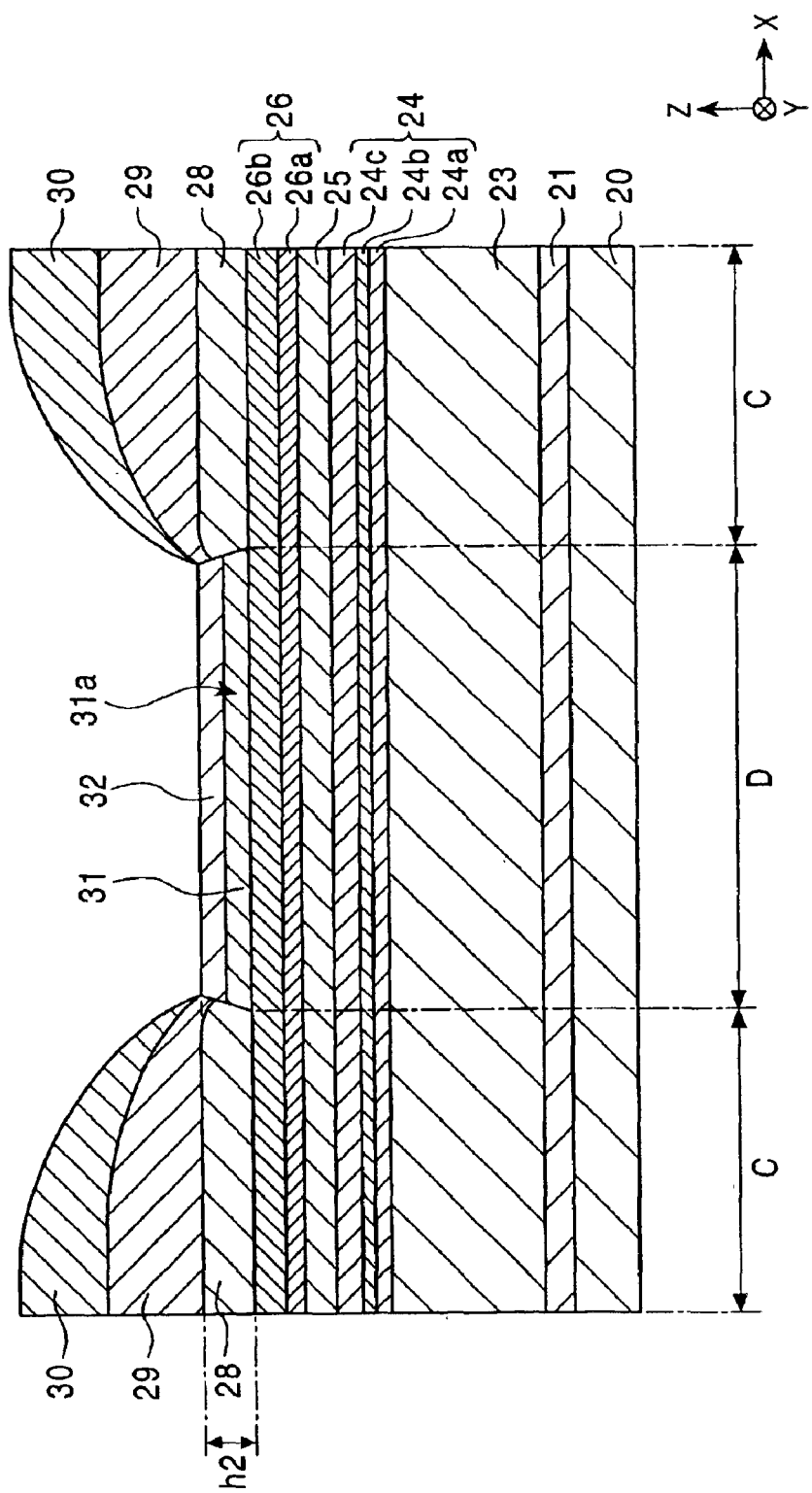
FIG. 4 is a partial sectional view of the structure of a magnetic sensing element according to a fourth embodiment of the present invention, taken along the side facing a recording medium.

FIG. 4 is a partial sectional view of the structure of a magnetic sensing element according to a fourth embodiment of the present invention, as viewed from the side facing a recording medium.

In the embodiment shown in FIG. 4, the forms of layers are the same as the embodiment shown in FIG. 3 except the specular layer 31. Therefore, the specular layer 31 is mainly described below.

In FIG. 4, the specular layer 31 is formed only on the central portion D of the free magnetic layer 26, without being formed on both end portions C of the free magnetic layer 26. As described above with reference to FIG. 3, the total thickness h2 of the specular layer 31 and the nonmagnetic layer 32 formed on the central portion D of the free magnetic layer 26 is 5 Å to 20 Å.

Therefore, in the present invention, the specular layer 31 and the nonmagnetic layer 32 can be appropriately removed from both end portions C of the free magnetic layer 26 even by using low-energy ion milling in the ion milling step.

Namely, in the present invention, low-energy ion milling is used, and thus the milling rate can be decreased to be lower than that of high-energy milling to permit the removal of only the specular layer 31 and the nonmagnetic layer 32. Therefore, milling can be properly controlled to minimize damage to both end portions C of the free magnetic layer 26 by ion milling.

Therefore, in the embodiment shown in FIG. 4, both end portions C of the free magnetic layer 26 are less damaged by ion milling, and thus the magnetic properties of both end portions C of the free magnetic layer 26 can be maintained in a good state. Furthermore, the ferromagnetic layers 28 and the second antiferromagnetic layers 29 are formed on both end portions C of the free magnetic layer 26, and magnetizations of the ferromagnetic layers 28 are strongly pinned in the track width direction by exchange coupling magnetic fields between the ferromagnetic layers 28 and the antiferromagnetic layers 29. As a result, magnetizations of both end portions C of the free magnetic layer 26 ferromagnetically coupled with the ferromagnetic layers 28 can be strongly put into the single magnetic domain state in the track width direction.

Therefore, in the present invention, even with a narrower track, the magnetization of the free magnetic layer 26 can be effectively controlled, and the magnetic sensing element having the specular layer 31 and excellent for a higher recording density can be manufactured.

In the embodiment shown in FIG. 4, the materials and the thicknesses of the other layers are the same as the embodiment shown in FIG. 3 except the form of the specular layer 31. Thus, a detailed description of the other layers is omitted (refer to FIGS. 1 and 3).

Figure 5:
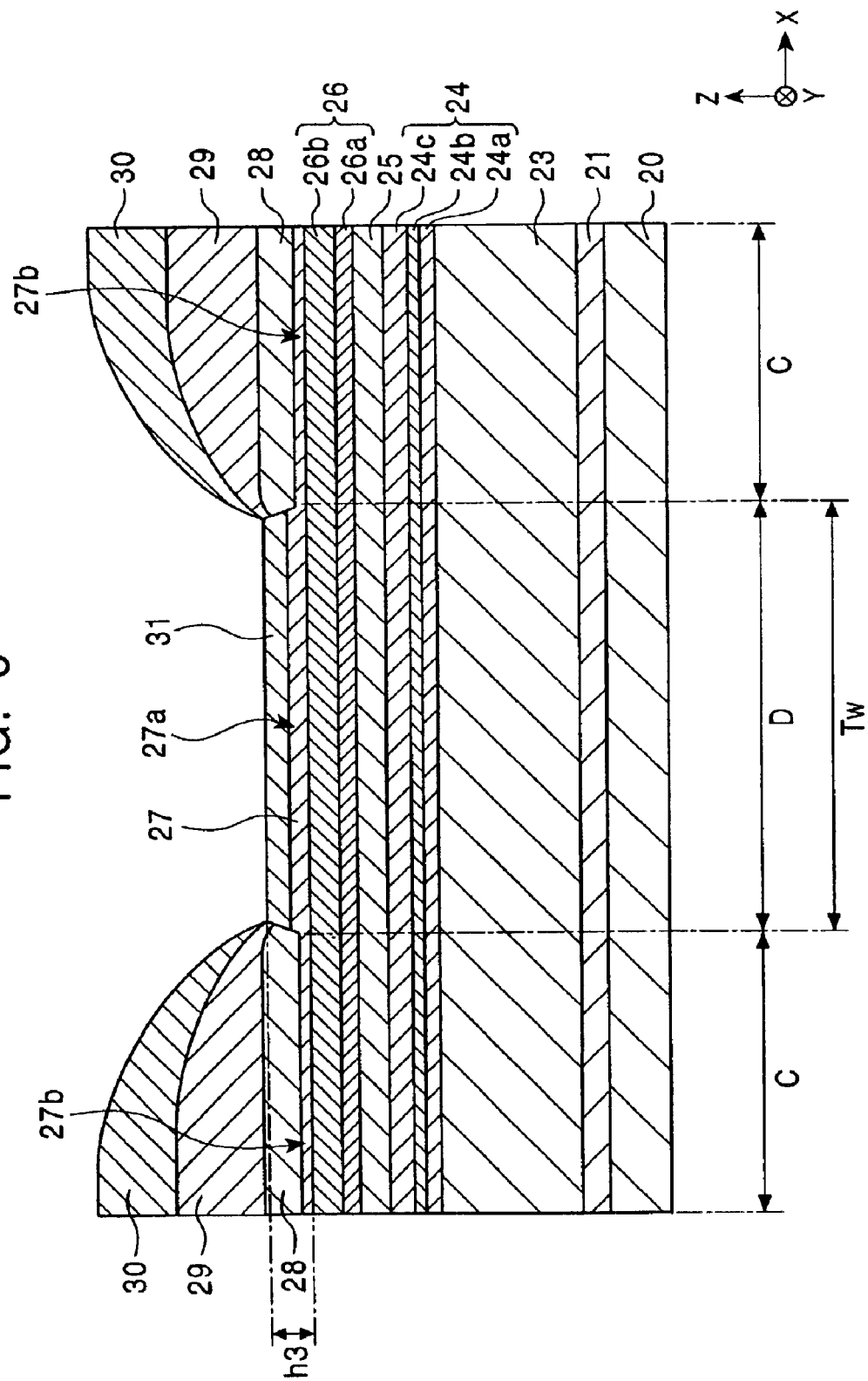
FIG. 5 is a partial sectional view of the structure of a magnetic sensing element according to a fifth embodiment of the present invention, taken along the side facing a recording medium.

FIG. 5 is a partial sectional view of the structure of a magnetic sensing element according to a fifth embodiment of the present invention, as viewed from the side facing a recording medium.

Unlike in the embodiments shown in FIGS. 1 to 4, in the embodiment shown in FIG. 5, the nonmagnetic layer 32 is not formed on the specular layer 31. In FIGS. 1 to 4, the reason for forming the nonmagnetic layer 32 is to cause the nonmagnetic layer 32 to function as the anti-oxidation layer. However, in the embodiment shown in FIG. 5, the specular layer 31 itself has the specular effect and the function as the anti-oxidization layer for protecting the free magnetic layer 26 and the backed layer 27 from oxidization by air exposure.

In the present invention, in order that the specular layer 31 functions as the anti-oxidization layer, even with a small thickness, the specular layer 31 must function as the anti-oxidization layer. Therefore, an oxide or nitride of Ta, which can be used in the embodiment shown in FIG. 4, cannot be used for the specular layer 31 in the embodiment shown in FIG. 5. This is because with the specular layer 31 having a small thickness and comprising a Ta oxide or nitride, the backed layer 27 and the free magnetic layer 26 formed below the specular layer 31 are oxidized by air exposure.

The specular layer 31 used in the embodiment shown in FIG. 5 must be made of a material having the property that oxidization by air exposure does not easily proceed deep. In the present invention, the specular layer 31 is preferably made of an oxide or nitride comprising at least one of Cr, Mo, W, Ti, Si, Ge and Al.

The specular layer 31 comprising such a material comprises a dense layer having a low rate of oxidization by air exposure. For example, even when a Cr thin film is formed on the backed layer 27 in the deposition step, the Cr film has a low rate of oxidization by air exposure, and can thus minimize the influence of oxidization by air exposure on the packed layer 27 and the free magnetic layer formed below the Cr film.

In the present invention, the specular layer 31 made of an oxide or nitride comprising at least one of Cr, Mo, W, Ti, Si, Ge and Al is preferably formed to a thickness of 3 Å to 15 Å. The specular layer 31 having a thickness of less than 3 Å is undesirable because the backed layer 27 and the free magnetic layer 26 are easily oxidized through the specular layer 31. On the other hand, with the specular layer 31 having a thickness of over 15 Å, the total thickness h3 of the backed layer 27 and the specular layer 31 formed on both end portions C of the free magnetic layer 26 in the deposition step becomes 20 Å or more. Therefore, in some cases, the specular layer 31 and the backed layer 27 cannot be completely removed from both end portions C of the free magnetic layer 26 by low-energy ion milling. As a result, conventional high-energy ion milling must be used, and thus both end portions C of the free magnetic layer 26 are undesirably easily damaged by ion milling.

In the embodiment shown in FIG. 5, the total thickness h3 of the backed layer 27 and the specular layer 31 formed on the central portion D of the free magnetic layer 26 is preferably 5 Å to 20 Å. The reason for setting the minimum of the total thickness h3 to 5 Å is that the minimum thickness of the backed layer 27 is 2 Å, and the minimum thickness of the specular layer 31 is 3 Å.

In the present invention, when the total thickness h3 is 20 Å or less, the backed layer 27 and the specular layer 31 can be removed from both end portions C of the free magnetic layer 26 by using low-energy ion milling in the ion milling step, thereby preventing both end portions C of the free magnetic layer 26 formed being damaged by ion milling, as compared with a conventional method.

In the embodiment shown in FIG. 5, both end portions 27b of the backed layer 27 are partially left on both sides C of the free magnetic layer 26, and the ferromagnetic layers 28 are respectively formed on both end portions 27b. Namely, in FIG. 5, both end portions 27b of the backed layer 27 are interposed between both end portions C of the free magnetic layer 26 and the ferromagnetic layers 28. However, both end portions 27b of the backed layer 27 are preferably formed to a thickness of as small as 0.2 Å to 3 Å. The thickness "0.2 Å" is the average over the whole of both end portions 27b of the backed layer 27. The thickness of 0.2 Å is smaller than the thickness of an atomic layer, and at both end portions 27b, a portion having the constituent atoms of the backed layer 27 and a portion without the constituent atoms are thus islanded. Therefore, the thickness "0.2 Å" is the average over the whole of both end portions 27b of the backed layer 27.

As described above, each of both end portions 27b of the backed layer 27 is formed to a thickness of as small as 0.2 Å to 3 Å, so that ferromagnetic coupling occurs between both end portions C of the free magnetic layer 26 and the ferromagnetic layers 28. The ferromagnetic layers 28 are strongly put into a single magnetic domain state in the track width direction (the X direction) by exchange coupling magnetic fields produced between the ferromagnetic layers 28 and the second antiferromagnetic layers 29 respectively formed thereon. As a result, both end portions C of the free magnetic layer 26 on which ferromagnetic coupling with the ferromagnetic layers 28 is exerted are also oriented in the same direction as the magnetization direction of the ferromagnetic layers 28, and strongly put into a single magnetic domain state in the track width direction (the X direction).

The term "ferromagnetic coupling" represents that magnetization of each of both end portions C of the free magnetic layer 26 is oriented in the same direction as the magnetization direction of the ferromagnetic layers 28 by RKKY ferromagnetic coupling between both end portions C of the free magnetic layer 26 and the ferromagnetic layers 28 through both end portions 27b of the backed layer 27, or a direct exchange interaction through defects such as pin holes or the like, which are formed in both end portions 27b of the backed layer 27.

The constituent element of both end portions 27b of the backed layer 27 thermally diffuses by annealing in a magnetic field for producing exchange coupling magnetic fields between the ferromagnetic layers 28 and the second antiferromagnetic layers 29. For example, when each of the ferromagnetic layers 28 and the free magnetic layer 26 comprises a NiFe alloy, and the backed layer 27 comprises Cu, and particularly, when both end portions 27b of the backed layer 27 are formed to a very small thickness, both end portions 27b of the backed layer 27 disappear by the thermal diffusion, and a NiFeCu alloy layer is formed on each of the backed layer side surfaces of the free magnetic layer 26 and the ferromagnetic layers 28. Therefore, both end portions C of the free magnetic layer 26 and the ferromagnetic layers 28 function as an integrated ferromagnetic layer.

Therefore, when the magnetizations of the ferromagnetic layers 28 are pinned in the track width direction (the X direction) by the exchange coupling magnetic fields produced between the ferromagnetic layers 28 and the antiferromagnetic layers 29, both end portions C of the free magnetic layer 26 are oriented in the same direction as the magnetization direction of the ferromagnetic layers 28, and strongly put into the single magnetic domain state in the track width direction (the X direction).

In the present invention, each of the ferromagnetic layers 28 is preferably formed to a thickness of 2 Å to 50 Å.

In the present invention, even when the ferromagnetic layers 28 are thinly formed, the ferromagnetic coupling can be effectively produced between the ferromagnetic layers 28 and both end portions C of the free magnetic layer 26. This is because both end portions C of the free magnetic layer 26 maintain the proper magnetic properties without being affected by ion milling. When each of the ferromagnetic layers 28 is formed to the above-described small thickness, large exchange coupling magnetic fields can be produced between the ferromagnetic layers 28 and the second antiferromagnetic layers 29. Furthermore, it is possible to appropriately suppress a problem in which an excessive static magnetic field from the inner side of each of the ferromagnetic layers 28 affects the central portion D of the free magnetic layer 26, deteriorating the sensitivity of the free magnetic layer 26.

As described above, in the embodiment shown in FIG. 5, the magnetization of each of both end portions C of the free magnetic layer 26 is appropriately fixed in the track width direction (the X direction).

On the other hand, the magnetization of the central portion D of the free magnetic layer 26 is weakly put into the single magnetic domain state in a level permitting reversal of magnetization. The width dimension of the central portion D in the track width direction (the X direction) substantially coincides with the track width Tw defined by the distance between the lower surfaces of the ferromagnetic layers 28 in the track width direction (the X direction). Therefore, even when narrowing of the track progresses with increases in the recording density, the region of the track width Tw can be properly defined as a sensitive region permitting reversal of magnetization, and the magnetic sensing element having the specular layer 31 and capable of appropriately complying with a higher recording density can be manufactured. The track width is preferably 0.2 $\mu$m or less.

In FIG. 5, the material of the specular layer 31 is an oxide or nitride comprising at least one of Cr, Mo, W, Ti, Si, Ge, and Al. However, the material of the specular layer 31 is not limited to this as long as the specular layer 31 made of a material other than the above material can protect the backed layer 27 and the free magnetic layer 26 from oxidization by air exposure even when the thickness is in the range of 3 Å to 15 Å.

The thicknesses and the materials of the layers not described above with reference to FIG. 5 are the same as FIG. 1 (refer to FIG. 1).

Figure 6:
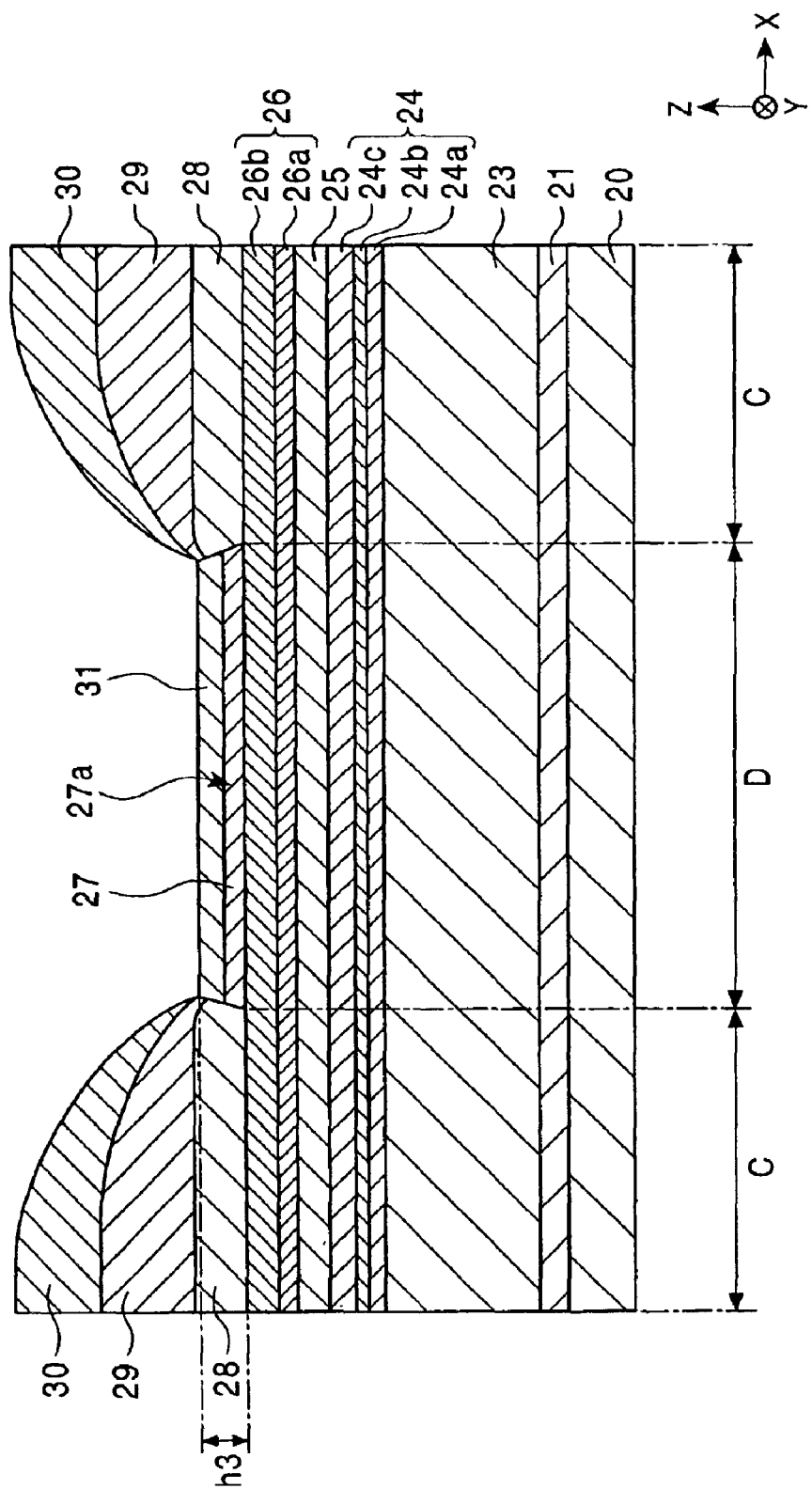
FIG. 6 is a partial sectional view of the structure of a magnetic sensing element according to a sixth embodiment of the present invention, taken along the side facing a recording medium.

FIG. 6 is a partial sectional view of the structure of a magnetic sensing element according to a sixth embodiment of the present invention, as viewed from the side facing a recording medium.

The embodiment shown in FIG. 6 is the same as the embodiment shown in FIG. 5 except that the form of a backed layer 27 is different from FIG. 5. Therefore, the form of the backed layer 27 is mainly described below.

In FIG. 6, the backed layer 27 is formed only on the central portion D of the free magnetic layer 26, without being formed on both end portions C of the free magnetic layer 26. As described above with reference to FIG. 5, the total thickness h3 of the backed layer 27 and the specular layer 31 formed on the free magnetic layer 26 is 5 Å to 20 Å.

Therefore, in the present invention, in the step of removing the backed layer 27 and the specular layer 31 from both end portions C of the free magnetic layer 26, only the backed layer 27 and the specular layer 31 can be appropriately removed even by low-energy ion milling.

Namely, in the present invention, low-energy ion milling is used, and thus the milling rate can be decreased as compared with high-energy milling to permit removal of only the backed layer 27 and the specular layer 31. Therefore, milling can be properly controlled to minimize damage to both end portions C of the free magnetic layer 26 by ion milling.

Therefore, in the embodiment shown in FIG. 6, both end portions C of the free magnetic layer 26 are less damaged by ion milling, and thus the magnetic properties of both end portions C of the free magnetic layer 26 can be maintained in a good state. Furthermore, the ferromagnetic layers 28 and the second antiferromagnetic layers 29 are formed on both end portions C of the free magnetic layer 26, and the magnetizations of the ferromagnetic layers 28 are strongly pinned in the track width direction by exchange coupling magnetic fields between the ferromagnetic layers 28 and the antiferromagnetic layers 29. As a result, the magnetizations of both end portions C of the free magnetic layer 26 ferromagnetically coupled with the ferromagnetic layers 28 can be strongly put into the single magnetic domain state in the track width direction.

Therefore, in the present invention, even with a narrower track, the magnetization of the free magnetic layer 26 can be effectively controlled, and the magnetic sensing element having the specular layer 31 and excellent for a higher recording density can be manufactured.

In the embodiment shown in FIG. 6, the materials and the thicknesses of the other layers are the same as the embodiment shown in FIG. 5 except that the form of the backed layer 27 is different. Thus, a detailed description of the other layers is omitted (refer to FIGS. 1 and 5).

Figure 7:
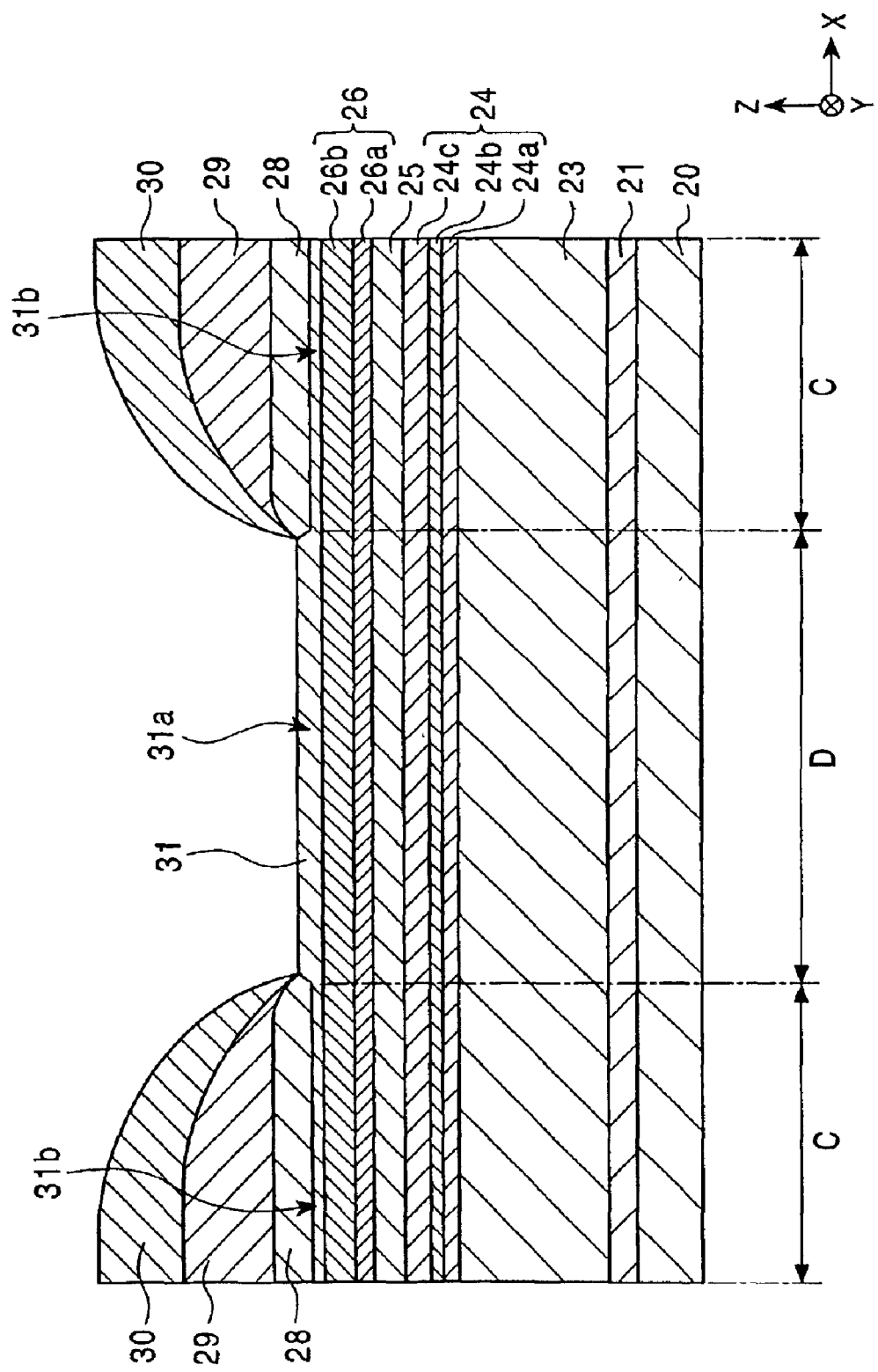
FIG. 7 is a partial sectional view of the structure of a magnetic sensing element according to a seventh embodiment of the present invention, taken along the side facing a recording medium.

FIG. 7 is a partial sectional view of the structure of a magnetic sensing element according to a seventh embodiment of the present invention, as viewed from the side facing a recording medium.

The embodiment shown in FIG. 7 is different from the embodiments shown in FIGS. 5 and 6 in that the backed layer 27 is not formed on the free magnetic layer 26. In FIG. 7, only the specular layer 31 is formed on the free magnetic layer 26.

In the embodiment shown in FIG. 7, the thickness of the central portion 31a of the specular layer 31 is larger than that of both end portions 31b.

As described above with reference to FIG. 5, the specular layer 31 is preferably made of an oxide or nitride comprising at least one of Cr, Mo, W, Ti, Si, Ge, and Al.

The thickness of the central portion 31a of the specular layer 31 is preferably 3 Å to 15 Å.

In the present invention, the specular layer 31 comprising the above material can be provided with the specular effect, and even with a thickness of as small as 3 Å to 15 Å, the specular layer 31 can be caused to function as the anti-oxidization layer.

In this embodiment, only the specular layer 31 having a thickness of as small as 3 Å to 15 Å is formed on the free magnetic layer 26, and thus the specular layer 31 can be removed from both end portions C of the free magnetic layer 26 by using low-energy ion milling in the ion milling step. Thus, the ion milling can easily be controlled to stop at a predetermined position.

In the embodiment shown in FIG. 7, both end portions 31b of the specular layer 31 are left on both end portions C of the free magnetic layer 26. However, the thickness of each of both end portions 31b of the specular layer is as small as 0.2 Å (the average over the whole of both end portions 31b) to 3 Å. When such thin ends 31b of the specular layer 31 are left, ferromagnetic coupling can be property produced between both end portions C of the free magnetic layer 26 and the ferromagnetic layers 28, both end portions C respectively facing the ferromagnetic layers 28 with both end portions 31b of the specular layer 31 provided therebetween. Alternatively, both end portions C of the free magnetic layer 26 and the ferromagnetic layers 28 can be combined to function as an integrated ferromagnetic layer by thermal diffusion, and both end portions C of the free magnetic layer 26 can be effectively put into the single magnetic domain state in the track width direction (the X direction).

On the other hand, the central portion D of the free magnetic layer 26 is weakly put into the single magnetic domain state in a level permitting reversal of magnetization with an external magnetic field.

In the embodiment shown in FIG. 7, it is possible to manufacture the magnetic sensing element having the specular layer 31 and capable of effectively controlling the magnetization of the free magnetic layer 26 even when the track is narrowed in future.

When the specular layer 31 can be appropriately provided with the function as the anti-oxidization layer even if the thickness of the central portion 31a of the specular layer 31 formed on the central portion D of the free magnetic layer 26 is as small as 3 Å or less, the thickness of the central portion 31a may be 3 Å or less. In this case, the central portion 31a of the specular layer 31 may be the same as the thicknesses of both end portions 31b.

The thicknesses and the material of the layers are not described with reference to FIG. 7, but are described above with reference to FIGS. 1 and 5 (refer to FIGS. 1 and 5).

Figure 8:
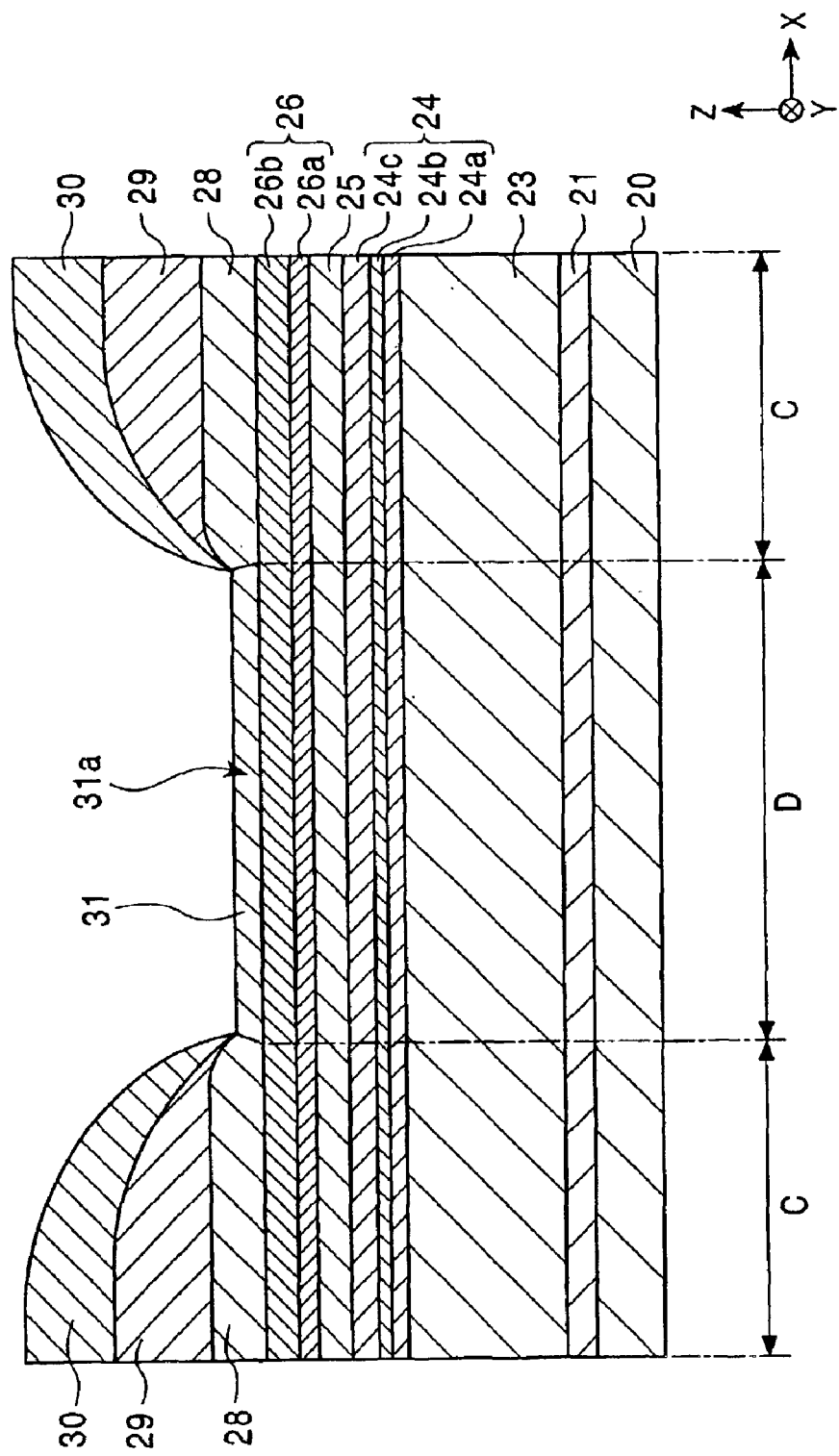
FIG. 8 is a partial sectional view of the structure of a magnetic sensing element according to an eighth embodiment of the present invention, taken along the side facing a recording medium.

FIG. 8 is a partial sectional view of the structure of a magnetic sensing element according to an eighth embodiment of the present invention, as viewed from the side facing a recording medium.

In the embodiment shown in FIG. 8, the forms of layers are the same as the embodiment shown in FIG. 7 except the specular layer 31. Therefore, the specular layer 31 is mainly described below.

In FIG. 8, the specular layer 31 is formed only on the central portion D of the free magnetic layer 26, without being formed on both end portions C of the free magnetic layer 26. As described above with reference to FIG. 7, the thickness of the specular layer 31 formed on the central portion D of the free magnetic layer 26 is 3 Å to 15 Å.

Therefore, in the present invention, the specular layer 31 can be appropriately removed from both end portions C of the free magnetic layer 26 even by using low-energy ion milling in the ion milling step.

Namely, in the present invention, low-energy ion milling is used, and thus the milling rate can be decreased as compared with high-energy milling to permit removal of only the specular layer 31. Therefore, milling can properly be controlled to minimize damage to both end portions C of the free magnetic layer 26 by ion milling.

Therefore, in the embodiment shown in FIG. 8, both end portions C of the free magnetic layer 26 are less damaged by ion milling, and thus the magnetic properties of both end portions C of the free magnetic layer 26 can be maintained in a good state. Furthermore, the ferromagnetic layers 28 and the second antiferromagnetic layers 29 are formed on both end portions C of the free magnetic layer 26, and the magnetizations of the ferromagnetic layers 28 are strongly pinned in the track width direction by exchange coupling magnetic fields between the ferromagnetic layers 28 and the antiferromagnetic layers 29. As a result, the magnetizations of both end portions C of the free magnetic layer 26 ferromagnetically coupled with the ferromagnetic layers 28 can be strongly put into the single magnetic domain state in the track width direction.

Therefore, in the present invention, even with a narrower track, magnetization of the free magnetic layer 26 can be effectively controlled, and the magnetic sensing element having the specular layer 31 and excellent for a higher recording density can be manufactured.

In the embodiment shown in FIG. 8, the materials and the thicknesses of the other layers are the same as the embodiment shown in FIG. 7 except that the form of the specular layer 31 is different. Thus, a detailed description of the other layers is omitted (refer to FIGS. 1 and 5).

Next, the form of the free magnetic layer 26 will be described below.

In each of the magnetic sensing elements shown in FIGS. 1 to 8, the free magnetic layer 26 has a two-layer structure comprising an anti-diffusion layer 26a made of CoFe or Co and provided in contact with the nonmagnetic material layer 25, and a magnetic material layer 26b comprising a magnetic material such as a NiFe alloy or the like.

The free magnetic layer 26 may comprise a single layer of a magnetic material. As the magnetic material, a NiFe alloy, a CoFe alloy, a CoFeNi alloy, Co, a CoNi alloy, or the like can be selected. Particularly, the free magnetic layer 26 preferably comprises a CoFeNi alloy.

FIG. 9 is an enlarged partial sectional view mainly showing the free magnetic layer 26, as viewed from the side facing a recording medium.

In the form shown in FIG. 9, the free magnetic layer 26 has a three-layer structure. All layers 36, 37 and 38 constituting the free magnetic layer 26 are magnetic material layers, the magnetic material layer 36 being an anti-diffusion layer for preventing diffusion of elements to the nonmagnetic material layer 25. The magnetic material layer 36 is made of CoFe, Co, or the like.

In the embodiments shown in FIGS. 1 and 5, the backed layer 27 is formed on both end portions of the magnetic material layer 38. In the embodiments shown in FIGS. 3 and 7, the specular layer 31 is formed on both end portions of the magnetic material layer 38. In this case, the magnetic material layer 38 preferably comprises a CoFe alloy so that RKKY ferromagnetic coupling between the ferromagnetic layers 28 and the nonmagnetic layer 38 with the backed layer 27 provide therebetween can be increased.

An example of a combination of materials for the three layers shown in FIG. 9 is a combination of the magnetic material layer 36: CoFe/the magnetic material layer 37: NiFe/the magnetic material layer 38: CoFe.

The thickness of the free magnetic layer 26 comprising only a magnetic material is preferably about 30 Å to 40 Å. The composition of the CoFe alloy used for the free magnetic layer 26 comprises, for example, 90 at % of Co and 10 at % of Fe.

FIG. 10 is an enlarged partial sectional view showing another form of the free magnetic layer 26. The structure of the free magnetic layer 26 shown in FIG. 10 is referred to as a "laminated ferrimagnetic structure". This permits a decrease in the effective magnetic thickness of the free magnetic layer 26 without excessively decreasing the physical thickness of the free magnetic layer 26, thereby improving sensitivity to an external magnetic field.

In FIG. 10, reference numeral 39 and 41 each denote a magnetic layer, and reference numeral 40 denotes a nonmagnetic intermediate layer. Each of the magnetic layers 39 and 41 comprises a magnetic material such as a NiFe alloy, a CoFe alloy, a CoFeNi alloy, Co, a CoNi alloy, or the like. Particularly, the magnetic layer 39 and/or the magnetic layer 41 preferably comprises a CoFeNi alloy. The composition preferably comprises 9 at % to 17 at % of Fe, 0.5 at % to 10 at % of Ni, and the balance of Co.

Consequently, a coupling magnetic field due to a RKKY interaction between the magnetic layers 39 and 41 can be increased. Specifically, a spin-flop magnetic field (Hsp) can be increased to about 293 (kA/m) or more. Therefore, magnetizations of the magnetic layers 39 and 41 can be appropriately put into an antiparallel state. Within the above composition range, the magneto-striction of the free magnetic layer 26 can be maintained in the range of $-3\times10^{-6}$ to $3\times10^{-6}$, and coercive force can be decreased to 790 (A/m) or less.

Furthermore, it is possible to properly improve the soft magnetic characteristics of the free magnetic layer 26, and suppress decreases in the amount ($\Delta R$) and the rate ($\Delta R/R$) of change in resistance due to Ni diffusion to the nonmagnetic material layer 25.

The nonmagnetic intermediate layer 40 preferably comprises at least one of Ru, Rh, Ir, Cr, Re and Cu.

For example, the thickness of the magnetic layer 39 is about 35 Å, the thickness of the nonmagnetic layer 40 is about 9 Å, and the thickness of the magnetic layer 41 is about 15 Å.

Also, the anti-diffusion layer comprising a CoFe alloy or Co may be formed between the magnetic layer 39 and the nonmagnetic material layer 25. Furthermore, a magnetic layer comprising a CoFe alloy may be formed on the magnetic layer 41.

In this case, with the magnetic layer 39 and/or the magnetic layer 41 comprising a CoFeNi alloy, the composition of the CoFeNi alloy preferably comprises 7 at % to 15 at % of Fe, 5 at % to 15 at % of Ni, and the balance of Co.

Consequently, a coupling magnetic field due to a RKKY interaction between the magnetic layers 39 and 41 can be increased. Specifically, a spin-flop magnetic field (Hsp) can be increased to about 293 (kA/m) or more. Therefore, magnetizations of the magnetic layers 39 and 41 can be appropriately put into an antiparallel state.

Within the above composition range, the magneto-striction of the free magnetic layer 26 can be maintained in the range of $-3\times10^{-6}$ to $3\times10^{-6}$, and the coercive force can be decreased to 790 (A/m) or less. Furthermore, the soft magnetic characteristics of the free magnetic layer 26 can be improved.

Figure 11:
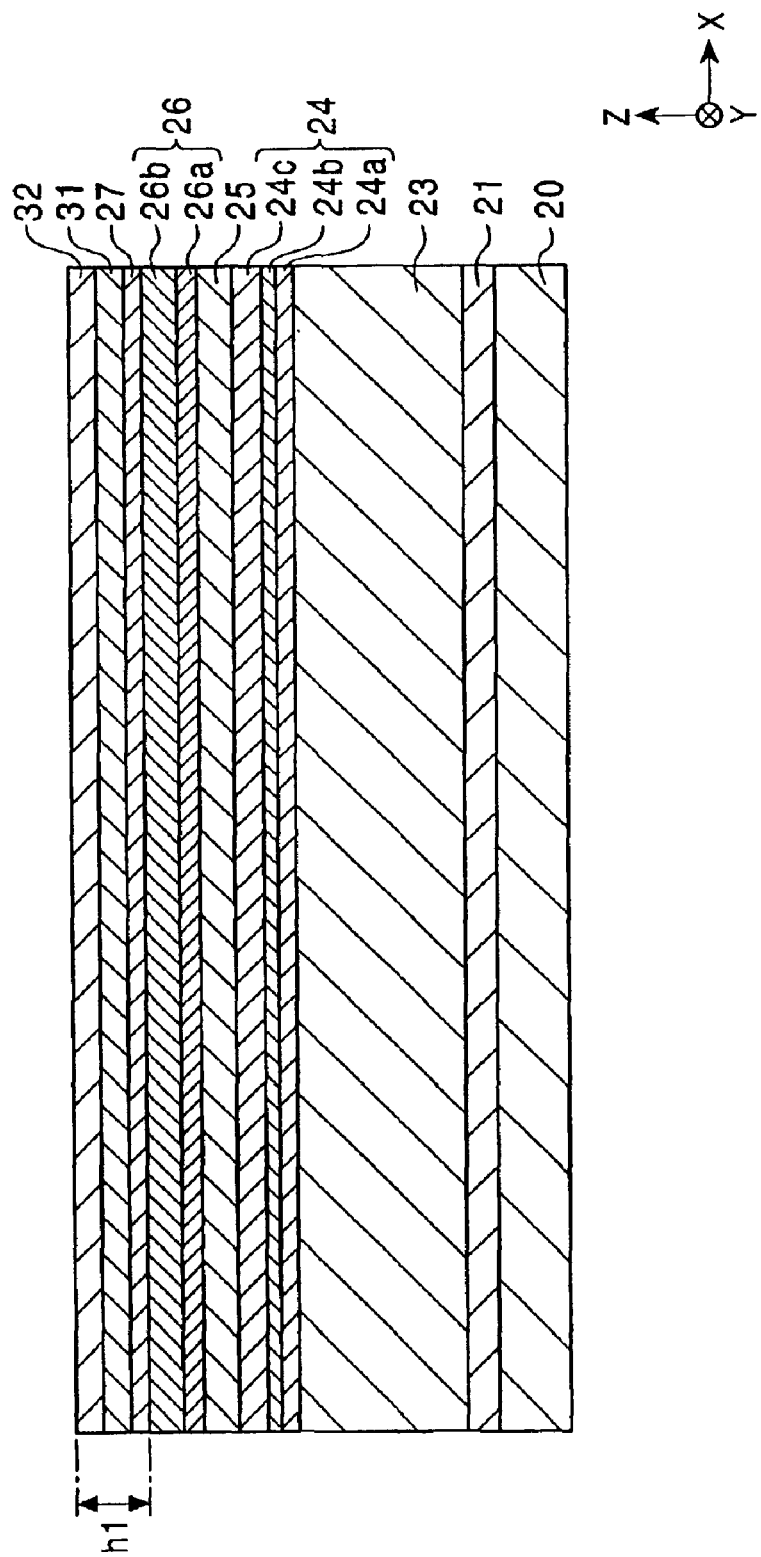
FIG. 11 is a drawing showing a step for manufacturing the magnetic sensing element shown in FIG. 1.
Figure 12:
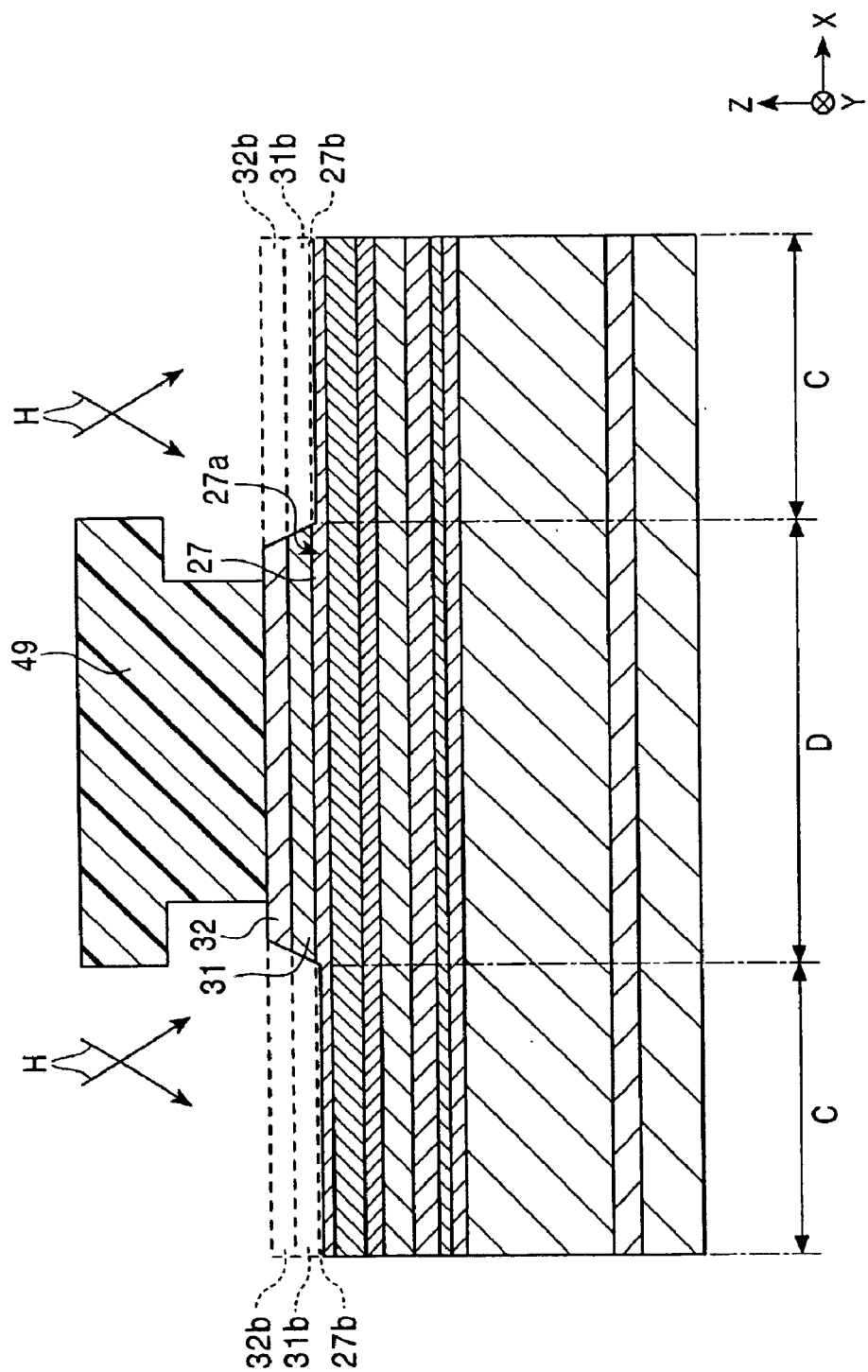
FIG. 12 is a drawing showing a step next to the step shown in FIG. 11.
Figure 13:
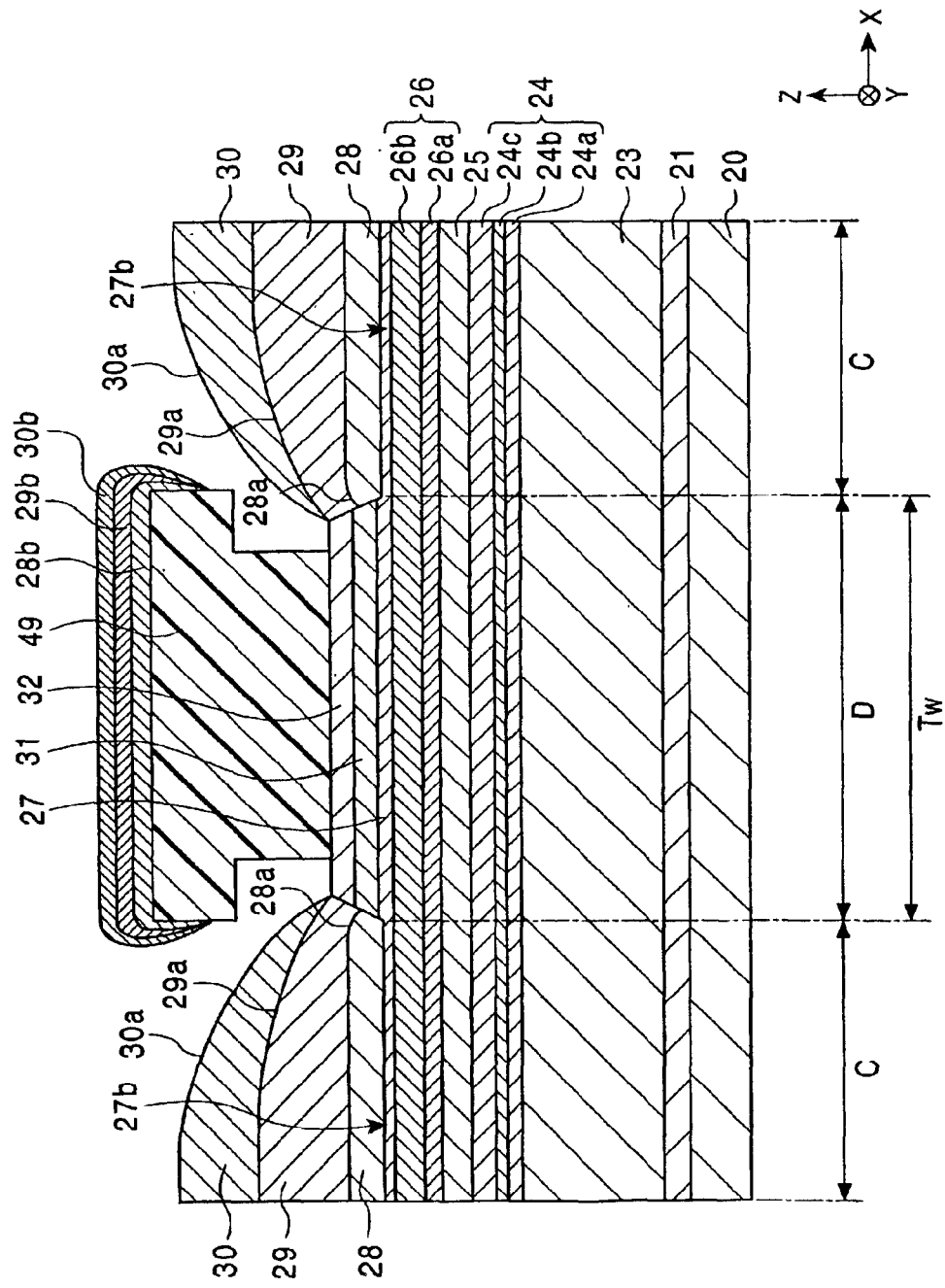
FIG. 13 is a drawing showing a step next to the step shown in FIG. 12.

FIGS. 11 to 13 are drawings respectively showing steps of a method of manufacturing the magnetic sensing element shown in FIG. 1. Each of FIGS. 11 to 13 is a partial sectional view taken along the side facing the recording medium.

In the step shown in FIG. 11, the seed layer 21 comprising a NiFe alloy, a NiFeCr alloy or Cr is formed on the substrate 20.

Then, the first antiferromagnetic layer 23, the pinned magnetic layer 24, the nonmagnetic material layer 25, the free magnetic layer 26, the backed layer 27, and the specular layer 31 are continuously deposited on the seed layer 21. Deposition of these layers is performed by a sputtering or vapor deposition method. The pinned magnetic layer 24 shown in FIG. 11 has a laminated ferrimagnetic structure comprising the magnetic layers 24a and 24c each comprising, for example, a CoFe alloy, and the nonmagnetic intermediate layer 24b of Ru interposed between both magnetic layers 24a and 24c. The free magnetic layer 26 has a laminated structure comprising the antiferromagnetic layer 26a comprising a CoFe alloy, and the magnetic material layer 26b comprising a NiFe alloy.

In the present invention, the first antiferromagnetic layer 23 is preferably made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe and Kr) alloy.

In the PtMn alloy and the alloy represented by the formula X—Mn, Pt or X is preferably in the range of 37 to 63 at %, and more preferably in the range of 47 to 57 at %. The upper and lower limits of these ranges represent "not more than" and "not less than", respectively, unless otherwise specified.

In the alloy represented by the formula Pt—Mn—X', X'+Pt is preferably in the range of 37 to 63 at %, and more preferably in the range of 47 to 57 at %. In the alloy represented by the formula Pt—Mn—X', X' is preferably in the range of 0.2 to 10 at %. However, when X' is at least one of Pd, Ir, Rh, Ru, Os, Ni and Fe, X' is preferably in the range of 0.2 to 40 at %.

In the present invention, the first antiferromagnetic layer 23 is preferably formed to a thickness of 80 Å to 300 Å. By forming such a thick first antiferromagnetic layer 23, a large exchange coupling magnetic field can be produced between the first antiferromagnetic layer 23 and the pinned magnetic layer 24 by annealing in a magnetic field. Specifically, an exchange coupling magnetic field of 48 kA/m or more, for example, over 64 kA/m, can be produced.

In the step shown in FIG. 11, the backed layer 27 is preferably formed to a thickness of 2 Å to 5 Å. By forming the backed layer 27 having such a thickness, the spin filter effect can be appropriately exhibited. With the backed layer 27 having a thickness of over this range, the total thickness h1 of the layers formed on the free magnetic layer 26 easily increases to 20 Å or more, and thus both end portions C of the free magnetic layer 26 are easily damaged by ion milling in the next ion milling step. Also, the backed layer 27 is preferably made of Cu, Ag, Au, Ru, or the like.

In the step shown in FIG. 11, the specular layer 31 is preferably formed by using an oxide or nitride comprising at least one of Ti, Zr, Hf, V, Nb, Ta, Al, Si, Ge, Cr, Mo, W and the rare earth elements.

The method of forming the specular layer 31 will be described in detail below. In the present invention, first, an element film comprising at least one of Ti, Zr, Hf, V, Nb, Ta, Al, Si, Ge, Cr, Mo, W and the rare earth elements is preferably formed to a thickness of as small as 1 Å to 5 Å on the backed layer 27 by sputtering or vapor deposition. The manufacturing method of the present invention is characterized in that the element film of the specular layer 31 is deposited to a very small thickness.

With the element film of less than 1 Å, oxidization of the element film influences the backed layer 27 and the free magnetic layer 26, or the specular layer 31 undesirably cannot exhibit the effective specular effect.

With the element film of over 5 Å, oxidization of the element film produces the specular layer 31 having a thickness of as large as 10 Å or more. Particularly, in the step shown in FIG. 11, not only the specular layer 31 but also the backed layer 27 and the nonmagnetic layer 32 described below are formed on the free magnetic layer 26, thereby increasing the total thickness h1 of the layers formed on the free magnetic layer 26 to over 20 Å. Therefore, both end portions C of the free magnetic layer 26 are undesirably easily damaged by ion milling in the next ion milling step.

After the element film comprising at least one of Ti, Zr, Hf, V, Nb, Ta, Al, Si, Ge, Cr, Mo, W and the rare earth elements is formed to a thickness of as small as 1 Å to 5 Å on the backed layer 27, the element film is oxidized or nitrided at low pressure in the vacuum container.

The element film can be slowly oxidized or nitrided by low-pressure oxidization or nitriding in the vacuum container. Therefore, even when the element film has a thickness of as small as 1 Å to 5 Å, the element film can be appropriately oxidized or nitrided while properly preventing oxidization or nitriding of the backed layer 27 and the free magnetic layer 26.

The oxidization is preferably natural oxidization, radical oxidization or plasma oxidization at low pressure.

In the present invention, the gas pressure in the vacuum container is preferably 0.13 Pa to $1.3 \times 10^4$ Pa.

In the oxidization or nitriding step, the element film is oxidized or nitrided to form the specular layer 31 having a larger thickness than that of the element film in the deposition step. However, as described above, the element film has a very small thickness of 1 Å to 5 Å in the deposition step, and thus the thickness of the specular layer 31 formed by oxidization or nitriding is 3 Å to 10 Å, thereby maintaining the specular layer 31 very thin.

In the present invention, after the specular layer 31 is formed in the vacuum container, the nonmagnetic layer 32 shown in FIG. 11 is formed on the specular layer 31 by sputtering or vapor deposition in the vacuum container with the magnetic sensing element being held in the vacuum container during manufacture. By depositing the nonmagnetic layer 32 in the vacuum container, the specular layer 31 is not exposed to the air, and thus the specular layer 31, the backed layer 27 and the free magnetic layer 26 can be appropriately protected from oxidization by air exposure before the nonmagnetic layer 32 is formed.

In the present invention, the nonmagnetic layer 32 is preferably made of at least one of Ru, Rh, Pd, Ir, Os, Re, Cr, Cu, Pt, and Au.

The nonmagnetic layer 32 made of the above element comprises a dense film hard to oxidize, and thus functions as the anti-oxidization layer even with a small thickness.

In the present invention, the nonmagnetic layer 32 is preferably formed to a small thickness of 2 Å to 8 Å. With the nonmagnetic layer 32 having a thickness of less than 2 Å, the function as the anti-oxidization layer deteriorates, thereby making the specular layer 31, the backed layer 27 and the free magnetic layer 26 formed below the specular layer 31 easy to oxidize.

On the other hand, with the nonmagnetic layer 32 having a thickness of 8 Å or more, the total thickness of the backed layer 27, the specular layer 31 and the nonmagnetic layer 32 formed on the free magnetic layer 26 becomes over 20 Å. Therefore, in the next step of ion milling both end portions C of the free magnetic layer 26, both end portions C of the free magnetic layer 26 are undesirably easily damaged by ion milling. When the specular layer 31 is formed by using an oxide or nitride comprising at least one of Cr, Mo, W, Ti, Si, Ge and Al, oxidation of the specular layer 31 less proceeds deeply even in the air. In this case, the specular layer 31 need not be formed in the vacuum container.

In the present invention, the thickness of each of the backed layer 27, the specular layer 31 and the nonmagnetic layer 32 formed on the free magnetic layer 26 is preferably controlled so that the total thickness h1 is 7 Å to 20 Å. With such a total thickness h1, each of the backed layer 27, the specular layer 31 and the nonmagnetic layer 32 can appropriately exhibit its function, and damage of the ion milling to both end portions C of the free magnetic layer 26 in the next ion milling step can be decreased.

As shown in FIG. 11, after each of the layers up to the nonmagnetic layer 32 is deposited on the substrate 20, first magnetic field annealing is performed. Namely, the layers are heat-treated at a first heat treatment temperature with a first magnetic field (the Y direction shown in the drawing) applied in a direction perpendicular to the track width Tw direction (the X direction shown in the drawing), to produce an exchange coupling magnetic field between the first antiferromagnetic layer 23 and the magnetic layer 24a constituting the pinned magnetic layer 24, so that the magnetization of the magnetic layer 24a is pinned in the Y direction shown in the drawing. The magnetization of the other magnetic layer 24c is pinned in the direction opposite to the Y direction by exchange coupling due to a RKKY interaction with the magnetic layer 24a. For example, the first heat treatment temperature is 270° C., and the magnitude of the magnetic field applied is 800 K (A/m).

In the step shown in FIG. 12, a resist layer 49 is formed on the upper surface of the nonmagnetic layer 32, and then exposed to light and developed to leave the resist layer 49 having the shape shown in FIG. 12 on the nonmagnetic layer 32. The resist layer 49 is, for example, a lift-off resist layer.

Next, both end portions 32b of the nonmagnetic layer 32, which are not covered with the resist layer 49, are removed by ion milling from the direction of arrow H shown in FIG. 12 (removing the portions of the nonmagnetic layer 32 as shown by dotted lines in FIG. 12).

Furthermore, after both end portions 32b of the nonmagnetic layer 32 are completely removed, both end portions 31*b* of the specular layer 31 formed below the nonmagnetic layer 32 are completely removed. Furthermore, both end portions 27*b* of the backed layer 27, which are exposed, are partially removed (leaving the portions of the specular layer 31 and the backed layer 27, as shown by dotted lines in FIG. 12).

In the step shown in FIG. 12, both end portions 27*b* of the backed layer 27 are thinly left on both end portions C of the free magnetic layer 26.

As described above, the total thickness h1 of the backed layer 27, the specular layer 31 and the nonmagnetic layer 32 formed on the free magnetic layer 26 is 20 Å or less. In the present invention, therefore, low-energy ion milling can be used in the ion milling step shown in FIG. 12. Since such low-energy ion milling can be used, ion milling can easily be controlled to stop at an intermediate position of both end portions 27*b* of the backed layer 27.

In this way, in the present invention, low-energy ion milling can be used, and thus controllability of the depth of milling can be improved, as compared with a conventional milling method.

However, when the backed layer 27 is formed to a small thickness of 3 Å or less, ion milling may be stopped at the moment when the surfaces of both end portions 27*b* of the backed layer 27 are exposed. In this case, the central portion 27*a* of the backed layer 27 can be formed to the same thickness as both end portions 27*b*.

The ion milling is preferably performed for a milling time of about 30 seconds to 60 seconds at a milling angle of 30° to 70°, preferably 40° to 60°, with respect to the direction perpendicular to the surface of the substrate 20. As a result, the backed layer 27 can be thinly left on both end portions C of the free magnetic layer 26.

In the present invention, the thickness of each of both end portions 27*b* of the backed layer 27, which are left on both end portions C of the free magnetic layer 26, is preferably 0.2 Å to 3 Å. In the next step, the ferromagnetic layers 28 are formed on both end portions 27*b* of the backed layer 27. However, when both end portions 27*b* of the backed layer 27 are thick, both end portions C of the free magnetic layer 26 are magnetically separated from the ferromagnetic layers 28, thereby failing to appropriately control the magnetization of each of both end portions C of the free magnetic layer 26.

In the present invention, both end portions 27*b* of the backed layer 27 are left in a thickness of 0.2 Å to 3 Å, and thus ferromagnetic coupling can be produced between both end portions C of the free magnetic layer 26 and the ferromagnetic layers 28, thereby permitting proper control of the magnetization of the free magnetic layer 26.

The term "ferromagnetic coupling" represents that each of both end portions C of the free magnetic layer 26 is magnetized in the same direction as the magnetization direction of the ferromagnetic layers 28 by RKKY ferromagnetic coupling between both end portions C of the free magnetic layer 26 and the ferromagnetic layers 28 through both end portions 27*b* of the backed layer 27, or a direct exchange interaction between both end portions C of the free magnetic layer 26 and the ferromagnetic layers 28 through defects such as pinholes or the like, which are formed in the backed layer 27.

Next, the step shown in FIG. 13 is performed. In the step shown in FIG. 13, the ferromagnetic layers 28, the second antiferromagnetic layers 29, and the electrode layers 30 are continuously deposited on both end portions 27*b* of the backed layer 27. These layers can be deposited by sputtering or vapor deposition. The upper surfaces 28*a* of the deposited ferromagnetic layers 28, the upper surfaces 29*a* of the deposited second antiferromagnetic layers 29, and the upper surfaces 30*a* of the deposited electrode layers 30 are inclined or curved surfaces so that the distance between both surfaces gradually increases in the direction (the Z direction shown in the drawing) from the lower side to the upper side.

In this embodiment, the track width Tw is defined by the distance between the lower surfaces of the ferromagnetic layers 28.

The material used for the second antiferromagnetic layers 29 is preferably the same as that used for the first antiferromagnetic layer 23.

Each of the second antiferromagnetic layers 29 is preferably formed to a thickness of as large as about 80 Å to 500 Å. This is because an exchange coupling magnetic field of appropriate magnitude can be produced between the second antiferromagnetic layers 29 and the ferromagnetic layers 28.

After the layers up to the electrode layers 30 are deposited as shown in FIG. 13, the resist layer 49 to which a ferromagnetic material layer 28*b* comprising the constituent elements of the ferromagnetic layers 28, an antiferromagnetic material layer 29*b* comprising the constituent elements of the second antiferromagnetic layers 29, and an electrode material layer 30*b* comprising the constituent elements of the electrode layers 30 are adhered is removed by liftoff.

Next, second magnetic field annealing is performed. In this annealing, the magnetic field direction coincides with the track width direction (the X direction shown in the drawing). In the second magnetic field annealing, a second applied magnetic field is lower than the exchange anisotropic magnetic field of the first antiferromagnetic layer 23, and the heat treatment temperature is lower than the blocking temperature of the first antiferromagnetic layer 23. Consequently, the exchange anisotropic magnetic field of the second antiferromagnetic layers 29 can be oriented in the track width direction (the X direction) while the exchange anisotropic magnetic field of the first antiferromagnetic layer 23 is oriented in the height direction (the Y direction). For example, the second heat treatment temperature is 250° C., and the magnitude of the magnetic field applied is 24 k (A/m).

As shown in FIG. 13, after the second antiferromagnetic layers 29 are formed on the ferromagnetic layers 28, the second magnetic field annealing is performed to produce the exchange coupling magnetic field between the ferromagnetic layers 28 and the second antiferromagnetic layers 29, so that magnetization of the ferromagnetic layers 28 is pinned in the track width direction (the X direction shown in the drawing). As a result, magnetization of each of both end portions C of the free magnetic layer 26 is pinned in the same direction as the magnetization direction of the ferromagnetic layers 28 by ferromagnetic coupling with the ferromagnetic layers 28 through both end portions 27*b* of the backed layer 27.

Alternatively, the constituent elements of both end portions 27*b* of the backed layer 27 thermally diffuse to the ferromagnetic layers 28 and both end portions C of the free magnetic layer 26 in the second magnetic field annealing, so that both end portions C of the free magnetic layer 26 and the ferromagnetic layers 28 can be caused to function as an integrated ferromagnetic layer, and thus both end portions C of the free magnetic layer 26 can be appropriately pinned in the track width direction.

The amount of the constituent elements of the backed layer 27, which diffuse to the surface of the free magnetic layer 26, is larger than to the bottom of the free magnetic layer 26. Conversely, the amount the constituent elements of the backed layer 27, which diffuse to the bottoms of the ferromagnetic layers 28, is larger than to the surfaces of the ferromagnetic layers 28. The ratio of the diffusing constituent elements of the backed layer 27 decreases from the surface to the bottom of the free magnetic layer 26, while the ratio of the diffusing constituent elements of the backed layer 27 decreases from the bottoms to the surfaces of the ferromagnetic layers 28. These changes in composition can be recognized by a SIMS analyzer (secondary ion mass spectrometer).

On the other hand, the ferromagnetic layers 28 and the second antiferromagnetic layers 29 are provided on only both end portions C of the free magnetic layer 26 without being provided on the central portion D of the free magnetic layer 26, and thus magnetization of the central portion D of the free magnetic layer 26 is not strongly pinned. The magnetization of the central portion D of the free magnetic layer 26 is put into the single magnetic domain state in the track width direction (the X direction) in a level permitting reversal of magnetization with an external magnetic field.

In the step shown in FIG. 13, each of the ferromagnetic layers 28 is preferably formed to a thickness of 2 Å to 50 Å.

In the present invention, both end portions C of the free magnetic layer 26 are not damaged by ion milling in the step shown in FIG. 12, and thus maintain the good magnetic characteristics. Therefore, even when the ferromagnetic layers 28 are formed to the above small thickness, ferromagnetic coupling with the ferromagnetic layers 28 can be increased. In the present invention, therefore, unlike a conventional element, the ferromagnetic layers 28 need not be formed to a large thickness, and thus the exchange coupling magnetic field produced between the ferromagnetic layers 28 and the second antiferromagnetic layers 29 can be sufficiently increased. At the same time, the influence of an excessive static magnetic field from the inner end 28a of each of the ferromagnetic layers 28 on the central portion D of the free magnetic layer 26 can be suppressed, thereby permitting the manufacture of the magnetic sensing element having excellent sensitivity even with a higher recording density.

As described above, the manufacturing method of the present invention can manufacture the magnetic sensing element permitting proper control of the magnetization of the free magnetic layer 26, and having the specular layer 31 having excellent reproduction sensitivity even with a narrower track, as compared with a conventional sensing element.

The magnetic sensing element shown in FIG. 1 can be manufactured by the above-described manufacturing method. In the method of manufacturing the magnetic sensing element shown in FIG. 2, both end portions 32b of the nonmagnetic layer 32, both end portions 31b of the specular layer 31 and both end portions 27b of the backed layer 27, all of which are positioned on both sides of the resist layer 49 in the track width direction (the X direction), are removed to expose both end portions C of the free magnetic layer 26 in the step shown in FIG. 12.

In the present invention, the total thickness h1 of the backed layer 27, the specular layer 31 and the nonmagnetic layer 32 formed on the free magnetic layer 26 in the step shown in FIG. 11 is 20 Å or less. Therefore, in the step shown in FIG. 12, all of both end portions 32b of the nonmagnetic layer 32, both end portions 31b of the specular layer 31 and both end portions 27b of the backed layer 27 can be removed by low-energy ion milling, and milling can easily be controlled to stop at the moment when both end portions 27b of the backed layer 27 are completely removed. In the present invention, therefore, even when both end portions C of the free magnetic layer 26 are exposed in the step shown in FIG. 12, both end portions C of the free magnetic layer 26 are less damaged by ion milling, thereby maintaining the magnetic characteristics of both end portions C of the free magnetic layer 26 in a good state. Thus, magnetization of the free magnetic layer 26 can be appropriately controlled.

In the method of manufacturing the magnetic sensing element shown in FIG. 3, the specular layer 31 and the nonmagnetic layer 32 are formed on the free magnetic layer 26 in the step shown in FIG. 11, and then both end portions 32b of the nonmagnetic layer 32, which are exposed from both sides of the resist layer 49 in the track width direction (the X direction), are completely removed in the step shown in FIG. 12. Furthermore, both end portions 31b of the specular layer 31, which are exposed from both sides, are partially removed to thinly (for example, 0.2 Å to 3 Å) leave both end portions 31b of the specular layer 31 on both end portions C of the free magnetic layer 26. Alternatively, when the specular layer 31 has a thickness of 3 Å or less, ion milling can be stopped not to further move the specular layer 31 at the moment when both end portions 31b are exposed. Then, the step shown in FIG. 13 may be performed.

In the method of manufacturing the magnetic sensing element shown in FIG. 4, the specular layer 31 and the nonmagnetic layer 32 are formed on the free magnetic layer 26 in the step shown in FIG. 11. Then, in the step shown in FIG. 12, both end portions 32b of the nonmagnetic layer 32 and both end portions 31b of the specular layer 31, which are exposed from both sides of the resist layer 49 in the track width direction (the X direction), are completely removed to expose the surfaces of both end portions C of the free magnetic layer 26. Then, the step shown in FIG. 13 may be performed.

Figure 14:
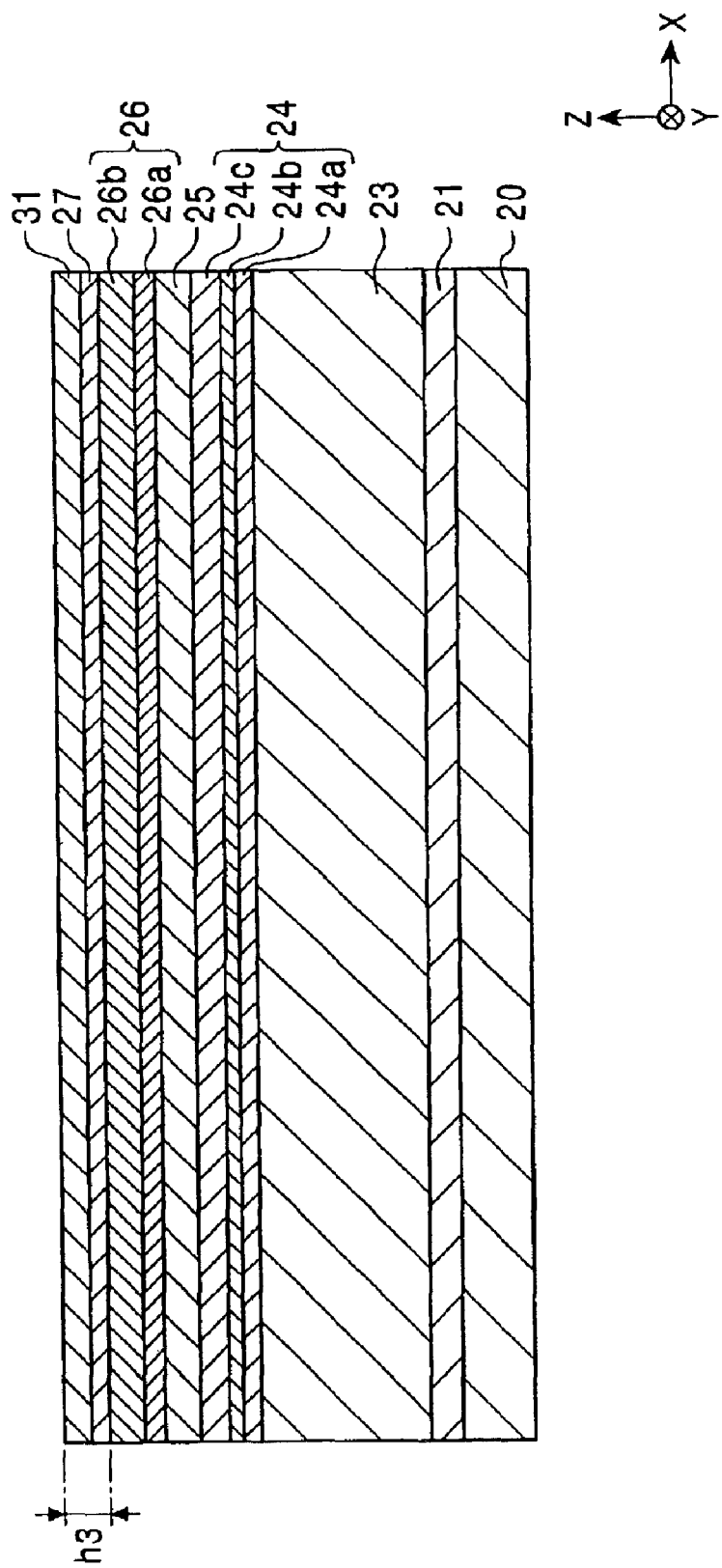
FIG. 14 is a drawing showing a step for manufacturing the magnetic sensing element shown in FIG. 5.
Figure 15:
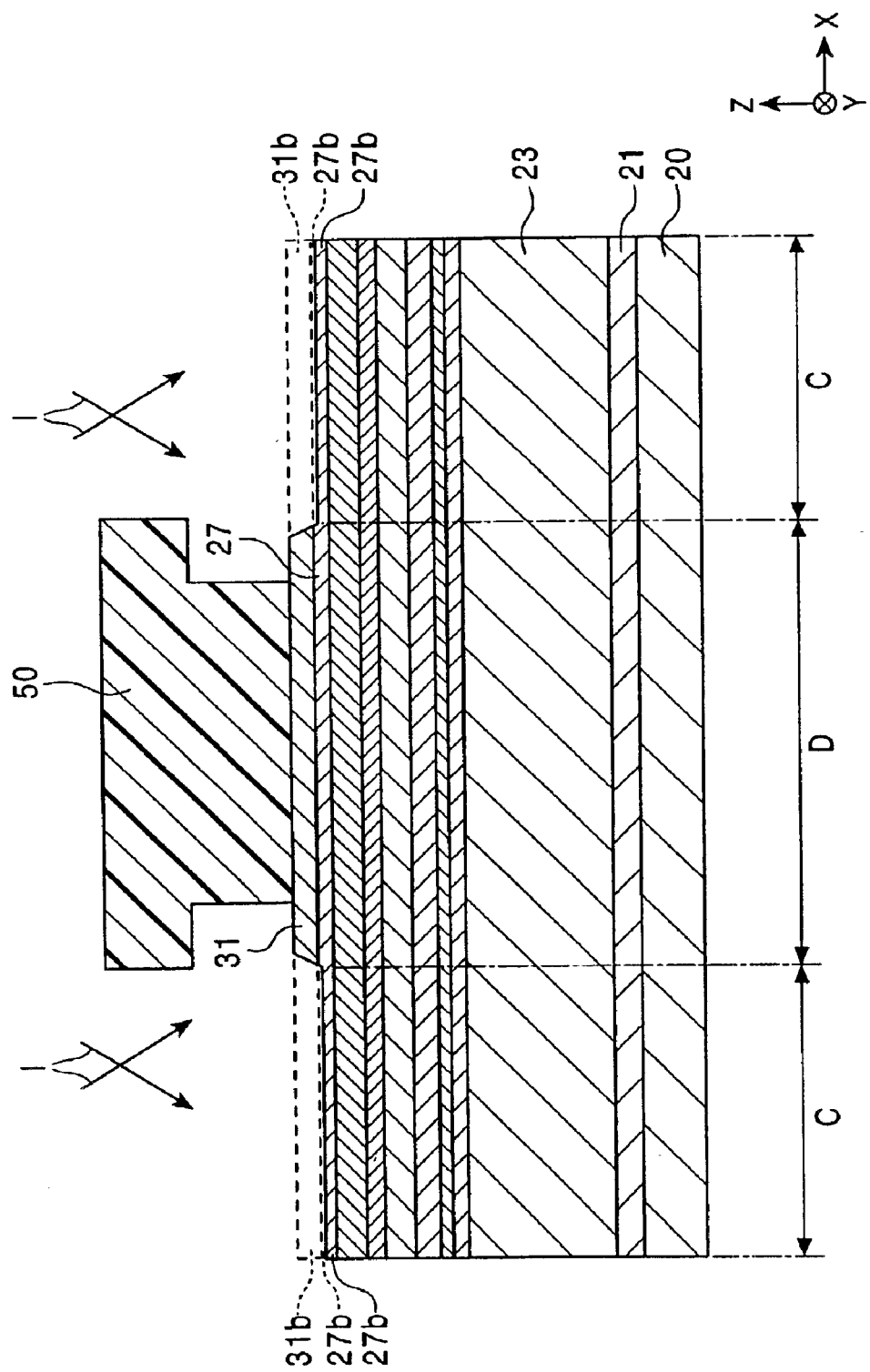
FIG. 15 is a drawing showing a step next to the step shown in FIG. 14.
Figure 16:
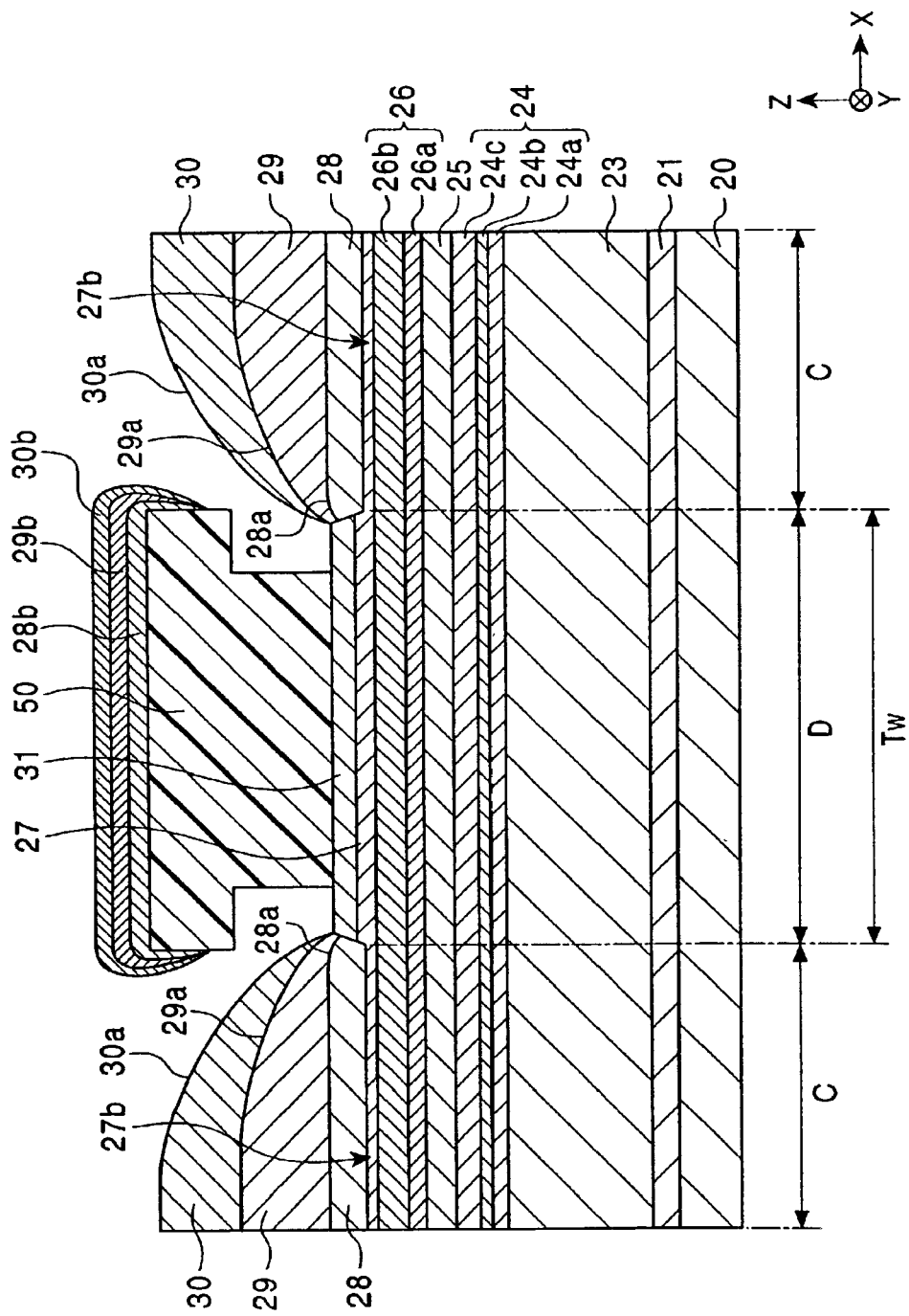
FIG. 16 is a drawing showing a step next to the step shown in FIG. 15.
Figure 17:
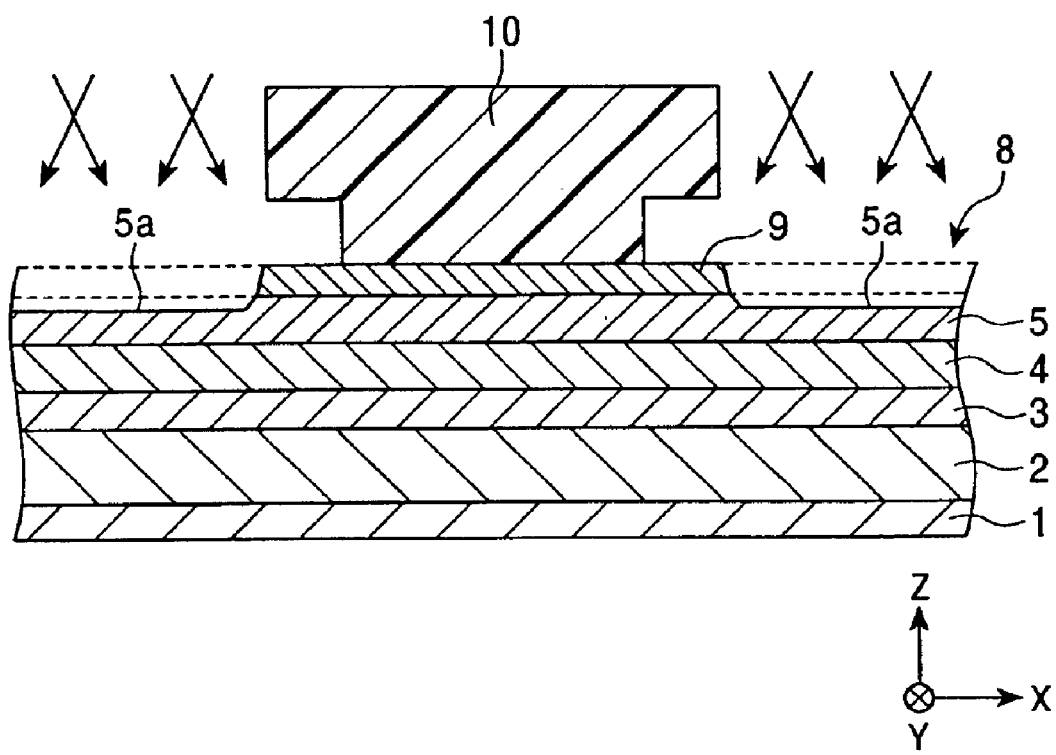
FIG. 17 is a drawing showing a step for manufacturing a conventional magnetic sensing element.
Figure 18:
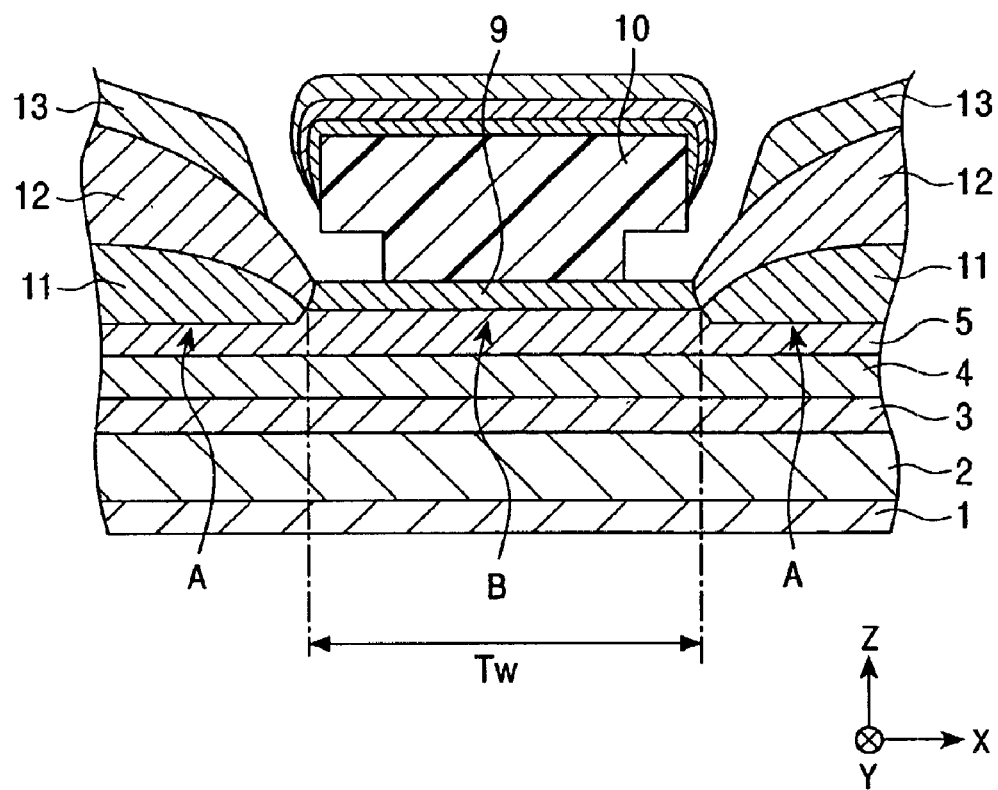
FIG. 18 is a drawing showing a step next to the step shown in FIG. 17.

FIGS. 14 to 16 are drawings respectively showing steps of a method of manufacturing the magnetic sensing element shown in FIG. 5. Each of FIGS. 11 to 13 is a partial sectional view taken along the side facing the recording medium.

In the step shown in FIG. 14, the seed layer 21 comprising a NiFe alloy, a NiFeCr alloy or Cr is formed on the substrate 20.

Then, the first antiferromagnetic layer 23, the pinned magnetic layer 24, the nonmagnetic material layer 25, the free magnetic layer 26, the backed layer 27, and the specular layer 31 are continuously deposited on the seed layer 21. Deposition of these layers is performed by a sputtering or vapor deposition method. The pinned magnetic layer 24 shown in FIG. 14 has a laminated ferrimagnetic structure comprising the magnetic layers 24a and 24c each comprising, for example, a CoFe alloy, and the nonmagnetic intermediate layer 24b of Ru interposed between both magnetic layers 24a and 24c. The free magnetic layer 26 has a laminated structure comprising the antiferromagnetic layer 26a comprising a CoFe alloy, and the magnetic material layer 26b comprising a NiFe alloy.

In the present invention, the first antiferromagnetic layer 23 is preferably made of a PtMn alloy, a X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe and Kr) alloy.

In the PtMn alloy and the alloy represented by the formula X—Mn, Pt or X is preferably in the range of 37 to 63 at %, and more preferably in the range of 47 to 57 at %. The upper and lower limits of these ranges represent "not more than" and "not less than", respectively, unless otherwise specified.

In the alloy represented by the formula Pt—Mn—X', X'+Pt is preferably in the range of 37 to 63 at %, and more preferably in the range of 47 to 57 at %. In the alloy represented by the formula Pt—Mn—X', X' is preferably in the range of 0.2 to 10 at %. However, when X' is at least one of Pd, Ir, Rh, Ru, Os, Ni and Fe, X' is preferably in the range of 0.2 to 40 at %.

In the present invention, the first antiferromagnetic layer 23 is preferably formed to a thickness of 80 Å to 300 Å. By forming such a thick first antiferromagnetic layer 23, a large exchange coupling magnetic field can be produced between the first antiferromagnetic layer 23 and the pinned magnetic layer 24 by annealing in a magnetic field. Specifically, an exchange coupling magnetic field of 48 kA/m or more, for example, over 64 kA/m, can be produced.

In the step shown in FIG. 14, the backed layer 27 is preferably formed to a thickness of 2 Å to 5 Å. By forming the backed layer 27 having a thickness within this range, the spin filter effect can be appropriately exhibited. With the backed layer 27 having a thickness of over this range, the total thickness h3 of the layers formed on the free magnetic layer 26 easily increases to 20 Å or more, and thus both end portions C of the free magnetic layer 26 are easily damaged by ion milling in the next ion milling step. Also, the backed layer 27 is preferably made of Cu, Ag, Au, Ru, or the like.

In the step shown in FIG. 14, the specular layer 31 is preferably formed by using an oxide or nitride comprising at least one of Cr, Mo, W, Ti, Si, Ge, and Al.

The material for the specular layer 31 used in the step shown in FIG. 14 is more limited than the material for the specular layer 31 used in the step shown in FIG. 11. The reason for this that the nonmagnetic layer 32 is not formed on the specular layer 31 in the step shown in FIG. 14, and thus the specular layer 31 itself must be provided with the function as the anti-oxidization layer.

The specular layer 31 comprising at least one element selected from Cr, Mo, W, Ti, Si, Ge, and Al has a low rate of oxidization by air exposure in the depth direction. Therefore, even when an element film is thinly formed on the backed layer 27, there is no problem in which oxidization reaches the backed layer 27 and the free magnetic layer 26.

In the present invention, first, an element film comprising at least one of Cr, Mo, W, Ti, Si, Ge, and Al is formed to a thickness of as small as 1 Å to 7 Å on the backed layer 27 by sputtering or vapor deposition. With the element film having a thickness of less than this range, the function of the element film as the anti-oxidization layer deteriorates, and thus the backed layer 27 and the free magnetic layer 26 are undesirably easily oxidized by air exposure. With the element film having a thickness of over the range, oxidization of the element film produces the specular layer 31 having a excessively large. Therefore, both end portions C of the free magnetic layer 26 are undesirably easily damaged by ion milling in the next ion milling step.

Since the element film has a very low rate of oxidation by air exposure in the depth direction, as compared with a Ta film or the like, oxidization does not reach the backed layer 27 and the free magnetic layer 26 through the element film even when the element film formed on the backed layer 27 is exposed to the air. Therefore, the element film has the function as the appropriate anti-oxidization layer.

The element film is oxidized to form the specular layer 31 having a larger thickness than that of the element film in the deposition step. However, the element film has a very small thickness of 1 Å to 7 Å in the deposition step, and thus the specular layer 31 formed by oxidization has a small thickness. In the present invention, the thickness of the specular layer 31 is preferably 3 Å to 15 Å. This is because with the specular layer 31 having an excessively large thickness, both end portions C of the free magnetic layer 26 are undesirably easily damaged by ion milling in the next ion milling step.

The element film is preferably oxidized by natural oxidization, radial oxidation or plasma oxidization. The element film may be nitrided to form the specular layer 31 comprising a nitride.

In the present invention, the thickness of each of the backed layer 27 and the specular layer 31 formed on the free magnetic layer 26 is preferably controlled so that the total thickness h3 is 5 Å to 20 Å. With such a total thickness h3, each of the backed layer 27 and the specular layer 31 can appropriately exhibit its function, and damage of the ion milling to both end portions C of the free magnetic layer 26 in the next ion milling step can be decreased.

As shown in FIG. 14, after each of the layers up to the specular layer 31 is deposited on the substrate 20, first magnetic field annealing is performed. Namely, the layers are heat-treated at a first heat treatment temperature with a first magnetic field (the Y direction shown in the drawing) applied in a direction perpendicular to the track width Tw direction (the X direction shown in the drawing), to produce an exchange coupling magnetic field between the first antiferromagnetic layer 23 and the magnetic layer 24a constituting the pinned magnetic layer 24, so that the magnetization of the magnetic layer 24a is pinned in the Y direction shown in the drawing. The magnetization of the other magnetic layer 24c is pinned in the direction opposite to the Y direction by exchange coupling due to a RKKY interaction with the magnetic layer 24a. For example, the first heat treatment temperature is 270° C., and the magnitude of the magnetic field applied is 800 K (A/m).

In the step shown in FIG. 15, a resist layer 50 is formed on the upper surface of the specular layer 31, and then exposed to light and developed to leave the resist layer 50 having the shape shown in FIG. 15 on the specular layer 31. The resist layer 50 is, for example, a lift-off resist layer.

Next, both end portions 31b of the specular layer 31, which are not covered with the resist layer 50, are removed by ion milling from the direction of arrow I shown in FIG. 15 (removing the portions of the specular layer 31 as shown by dotted lines in FIG. 15).

Furthermore, after both end portions 31b of the specular layer 31 are completely removed, both end portions 27b of the backed layer 27, which are exposed, are partially removed (leaving the portions of the specular layer 31 and the backed layer 27, as shown by dotted lines in FIG. 15).

In the step shown in FIG. 15, both end portions 27b of the backed layer 27 are thinly left on both end portions C of the free magnetic layer 26.

As described above, the total thickness h3 of the backed layer 27 and the specular layer 31 formed on the free magnetic layer 26 is 20 Å or less. In the present invention, therefore, low-energy ion milling can be used in the ion milling step shown in FIG. 15. Since such low-energy ion milling can be used, ion milling can easily be controlled to stop at an intermediate position of both end portions 27b of the backed layer 27.

In this way, in the present invention, low-energy ion milling can be used, and thus controllability of the depth of milling can be improved, as compared with a conventional milling method.

However, when the backed layer 27 is formed to a small thickness of 3 Å or less, ion milling may be stopped at the moment when the surfaces of both end portions 27b of the backed layer 27 are exposed. In this case, the central portion 27a of the backed layer 27 can be formed to the same thickness as both end portions 27b.

The ion milling is preferably performed for a milling time of about 30 seconds to 60 seconds at a milling angle of 30° to 70°, preferably 40° to 60°, with respect to the direction perpendicular to the surface of the substrate 20. As a result, both end portions 27b of the backed layer 27 can be thinly left on both end portions C of the free magnetic layer 26.

In the present invention, the thickness of each of both end portions 27b of the backed layer 27, which are left on both end portions C of the free magnetic layer 26, is preferably 0.2 Å to 3 Å. In the next step, the ferromagnetic layers 28 are formed on both end portions 27b of the backed layer 27. However, when both end portions 27b of the backed layer 27 are thick, both end portions C of the free magnetic layer 26 are magnetically separated from the ferromagnetic layers 28, thereby failing to appropriately control magnetization of each of both end portions C of the free magnetic layer 26.

In the present invention, both end portions 27b of the backed layer 27 are left in a thickness of 0.2 Å to 3 Å, and thus ferromagnetic coupling can be produced between both end portions C of the free magnetic layer 26 and the ferromagnetic layers 28, thereby permitting proper control of magnetization of the free magnetic layer 26.

The term "ferromagnetic coupling" represents that each of both end portions C of the free magnetic layer 26 is magnetized in the same direction as the magnetization direction of the ferromagnetic layers 28 by RKKY ferromagnetic coupling between both end portions C of the free magnetic layer 26 and the ferromagnetic layers 28 through both end portions 27b of the backed layer 27, or a direct exchange interaction between both end portions C of the free magnetic layer 26 and the ferromagnetic layers 28 through defects such as pinholes or the like, which are formed in the backed layer 27.

Next, the step shown in FIG. 16 is performed. In the step shown in FIG. 16, the ferromagnetic layers 28, the second antiferromagnetic layers 29, and the electrode layers 30 are continuously deposited on both end portions 27b of the backed layer 27. These layers can be deposited by sputtering or vapor deposition. The upper surfaces 28a of the deposited ferromagnetic layers 28, the upper surfaces 29a of the deposited second antiferromagnetic layers 29, and the upper surfaces 30a of the deposited electrode layers 30 are inclined or curved surfaces so that the distance between both surfaces gradually increases in the direction (the Z direction shown in the drawing) from the lower side to the upper side.

In this embodiment, the track width Tw is defined by the distance between the lower surfaces of the ferromagnetic layers 28.

The material used for the second antiferromagnetic layers 29 is preferably the same as that used for the first antiferromagnetic layer 23.

Each of the second antiferromagnetic layers 29 is preferably formed to a thickness of as large as about 80 Å to 500 Å. This is because an exchange coupling magnetic field of appropriate magnitude can be produced between the second antiferromagnetic layers 29 and the ferromagnetic layers 28.

After the layers up to the electrode layers 30 are deposited as shown in FIG. 16, the resist layer 50 to which a ferromagnetic material layer 28b comprising the constituent elements of the ferromagnetic layers 28, an antiferromagnetic material layer 29b comprising the constituent elements of the second antiferromagnetic layers 29, and an electrode material layer 30b comprising the constituent elements of the electrode layers 30 are adhered is removed by liftoff.

Next, second magnetic field annealing is performed. In this annealing, the magnetic field direction coincides with the track width direction (the X direction shown in the drawing). In the second magnetic field annealing, the second applied magnetic field is lower than the exchange anisotropic magnetic field of the first antiferromagnetic layer 23, and the heat treatment temperature is lower than the blocking temperature of the first antiferromagnetic layer 23. Consequently, the exchange anisotropic magnetic field of the second antiferromagnetic layers 29 can be oriented in the track width direction (the X direction) while the exchange anisotropic magnetic field of the first antiferromagnetic layer 23 is oriented in the height direction (the Y direction). For example, the second heat treatment temperature is 250° C., and the magnitude of the magnetic field applied is 24 k (A/m).

As shown in FIG. 16, after the second antiferromagnetic layers 29 are formed on the ferromagnetic layers 28, the second magnetic field annealing is performed to produce the exchange coupling magnetic fields between the ferromagnetic layers 28 and the second antiferromagnetic layers 29, so that the magnetizations of the ferromagnetic layers 28 are pinned in the track width direction (the X direction shown in the drawing). As a result, the magnetization of each of both end portions C of the free magnetic layer 26 is pinned in the same direction as the magnetization direction of the ferromagnetic layers 28 by ferromagnetic coupling with the ferromagnetic layers 28 through both end portions 27b of the backed layer 27.

Alternatively, the constituent elements of both sides portions 27b of the backed layer 27 thermally diffuse to the ferromagnetic layers 28 and both end portions C of the free magnetic layer 26 in the second magnetic field annealing, so that both end portions C of the free magnetic layer 26 and the ferromagnetic layers 28 can be combined to function as an integrated ferromagnetic layer, and thus both end portions C of the free magnetic layer 26 can be appropriately pinned in the track width direction.

The amount of the constituent elements of the backed layer 27, which diffuse to the surface of the free magnetic layer 26, is larger than to the bottom of the free magnetic layer 26. Conversely, the amount the constituent elements of the backed layer 27, which diffuse to the bottoms of the ferromagnetic layers 28, is larger than to the surfaces of the ferromagnetic layers 28. The ratio of the diffusing constituent elements of the backed layer 27 decreases from the surface to the bottom of the free magnetic layer 26, while the ratio of the diffusing constituent elements of the backed layer 27 decreases from the bottoms to the surfaces of the ferromagnetic layers 28. These changes in composition can be recognized by a SIMS analyzer (secondary ion mass spectrometer).

On the other hand, the ferromagnetic layers 28 and the second antiferromagnetic layers 29 are provided on only both end portions C of the free magnetic layer 26 without being provided on the central portion D of the free magnetic layer 26, and thus magnetization of the central portion D of the free magnetic layer 26 is not strongly pinned. The magnetization of the central portion D of the free magnetic layer 26 is put into the single magnetic domain state in the track width direction (the X direction) in a level permitting reversal of magnetization with an external magnetic field.

In the step shown in FIG. 16, each of the ferromagnetic layers 28 is preferably formed to a thickness of 2 Å to 50 Å.

In the present invention, both end portions C of the free magnetic layer 26 are not damaged by ion milling in the step shown in FIG. 15, and thus maintain the good magnetic characteristics. Therefore, even when the ferromagnetic layers 28 are formed to the above small thickness, ferromagnetic coupling with the ferromagnetic layers 28 can be increased. In the present invention, therefore, unlike a conventional element, the ferromagnetic layers 28 need not be formed to a large thickness, and thus the exchange coupling magnetic field produced between the ferromagnetic layers 28 and the second antiferromagnetic layers 29 can be sufficiently increased. At the same time, the influence of an excessive static magnetic field from the inner end 28a of each of the ferromagnetic layers 28 on the central portion D of the free magnetic layer 26 can be suppressed, thereby permitting the manufacture of the magnetic sensing element having excellent sensitivity even with a higher recording density.

As described above, the manufacturing method of the present invention can manufacture the magnetic sensing element permitting proper control of the magnetization of the free magnetic layer 26, and having the specular layer 31 having excellent reproduction sensitivity even with a narrower track, as compared with a conventional sensing element.

The magnetic sensing element shown in FIG. 5 can be manufactured by the above-described manufacturing method. In the method of manufacturing the magnetic sensing element shown in FIG. 6, both end portions 31b of the specular layer 31 and both end portions 27b of the backed layer 27, all of which are positioned on both sides of the resist layer 50 in the track width direction (the X direction), are removed to expose both end portions C of the free magnetic layer 26 in the step shown in FIG. 15.

In the present invention, the total thickness h3 of the backed layer 27 and the specular layer 31 and the nonmagnetic layer 32 formed on the free magnetic layer in the step shown in FIG. 14 is 20 Å or less. Therefore, in the step shown in FIG. 15, all of both end portions 31b of the specular layer 31 and both end portions 27b of the backed layer 27 can be removed by low-energy ion milling, and milling can easily be controlled to stop at the moment when both end portions 27b of the backed layer 27 are completely removed. In the present invention, therefore, even when both end portions C of the free magnetic layer 26 are exposed in the step shown in FIG. 15, both end portions C of the free magnetic layer 26 are less damaged by ion milling, thereby maintaining the magnetic characteristics of both end portions of the free magnetic layer 26 in a good state. Thus, the magnetization of the free magnetic layer 26 can be appropriately controlled.

In the method of manufacturing the magnetic sensing element shown in FIG. 7, the specular layer 31 is formed on the free magnetic layer 26 in the step shown in FIG. 14. Then, in the step shown in FIG. 15, both end portions 31b of the specular layer 31, which are exposed from both sides of the resist layer 50 in the track width direction (the X direction), are partially removed to thinly (for example, 0.2 Å to 3 Å) leave both end portions 31b of the specular layer 31 on both end portions C of the free magnetic layer 26. Then, the step shown in FIG. 16 may be performed.

When the specular layer 31 is formed to a thickness of as small as 3 Å or less in the step shown in FIG. 14, ferromagnetic coupling can be appropriately produced between both end portions C of the free magnetic layer 26 and the ferromagnetic layers 28, which oppose each other through both end portions C of the specular layer 31, without ion milling removal of both end portions 31b of the specular layer 31. Therefore, the step shown in FIG. 16 may be performed without ion milling in the step shown in FIG. 15.

In the method of manufacturing the magnetic sensing element shown in FIG. 8, the specular layer 31 is formed on the free magnetic layer 26 in the step shown in FIG. 14. Then, in the step shown in FIG. 15, both end portions 31b of the specular layer 31, which are exposed from both sides of the resist layer 50 in the track width direction (the X direction), are completely removed to expose the surfaces of both end portions C of the free magnetic layer 26. Then, the step shown in FIG. 16 may be performed.

The methods of manufacturing the magnetic sensing elements shown in FIGS. 1 to 8 are described based on the steps shown in FIGS. 11 to 16. However, the present invention relates to the magnetic sensing element comprising the specular layer 31, and the free magnetic layer 26 in which the magnetization is controlled in an exchange bias system. Particularly, even when the track is further narrowed with an increased in the recording density, the magnetization of the free magnetic layer 26 can be appropriately controlled.

Each of the magnetic sensing elements of the present invention shown in FIGS. 1 to 4 (the manufacturing method shown in FIGS. 11 to 13) is characterized in that the specular layer 31 and the nonmagnetic layer 32 are deposited on the free magnetic layer 26 so that the total thickness of the layers formed on the free magnetic layer 26 is small (specifically, 20 Å or less).

In order to realize the characteristic, each of the specular layer 31 and the nonmagnetic layer 32 must be formed to a small thickness. In the present invention, therefore, an element film comprising at least one of Ti, Zr, Hf, V, Nb, Ta, Al, Si, Ge, Cr, Mo, W and the rare earth elements is oxidized or nitrided in the vacuum container so that the thin specular layer 31, for example, of 3 Å to 10 Å can be formed.

Also, the nonmagnetic layer 32 is formed by using a material hard to oxidize by air exposure, specifically at least one of Ru, Rh, Pd, Ir, Os, Re, Cr, Cu, Pt, and Au, so that the thin nonmagnetic layer 32 of 2 Å to 8 Å can appropriately function as the anti-oxidization layer.

As described above, the total thickness of the specular layer 31 and the nonmagnetic layer 32 formed on the free magnetic layer 26 can be decreased. Therefore, in the step of removing the layers formed on both end portions C of the free magnetic layer 26 by ion milling, the ion milling can be performed with low energy, and thus the surfaces of both end portions C of the free magnetic layer 26 are less damaged by ion milling, thereby maintaining the magnetic characteristics of both end portions C of the free magnetic layer 26 in a good state. In the present invention, ferromagnetic coupling produced between both end portions C of the free magnetic layer 26 and the ferromagnetic layers 28 formed thereon can be increased, thereby permitting appropriate control of the magnetization of the free magnetic layer 26.

In the present invention, the specular layer 31 is formed by using an oxide or nitride comprising at least one element of Cr, Mo, W, Ti, Si, Ge and Al to impart the function as the anti-oxidation layer to the specular layer 31 even when the specular layer has a thickness of as small as 3 Å to 15 Å without the nonmagnetic layer 31. As a result, the total thickness of the layers formed on the free magnetic layer 26 can be properly decreased, and thus both end portions C of the free magnetic layer 26 are not damaged by ion milling, thereby permitting effective control of the magnetization of the free magnetic layer 26.

In the present invention, it is possible to manufacture the magnetic sensing element having the specular effect and permitting easy and appropriate control of the magnetization of the free magnetic layer.

In forming a reproducing magnetic head (MR head) by using the above-described magnetic sensing element, gap layers and shield layers are formed on and below the magnetic sensing element. In this case, a lower gap layer and a lower shield layer are formed between the seed layer 21 and the substrate 20. A recording inductive element may be further laminated on the MR head.

The magnetic sensing element of the present invention can also be provided on a built-in magnetic head of a hard disk device, and used for other magnetic sensors.

The above-described magnetic sensing element of the first embodiment of the present invention comprises the specular layer and the nonmagnetic layer formed on the central portion of the free magnetic layer, and the ferromagnetic layers and the second antiferromagnetic layers, which are formed on both end portions of the free magnetic layer.

In the present invention, an element film comprising at least one of Ti, Zr, Hf, V, Nb, Ta, Al, Si, Ge, Cr, Mo, W and the rare earth elements is oxidized or nitrided in a vacuum container so that the thin specular layer, for example, of 3 Å to 10 Å, can be formed.

Also, the nonmagnetic layer is formed by using a material hard to oxidize by air exposure, specifically at least one of Ru, Rh, Pd, Ir, Os, Re, Cr, Cu, Pt, and Au, so that the thin nonmagnetic layer of 2 Å to 8 Å can appropriately function as the anti-oxidization layer.

As described above, the total thickness of the specular layer and the nonmagnetic layer formed on the free magnetic layer can be decreased. Therefore, in the step of removing the layers formed on both end portions of the free magnetic layer by ion milling, the ion milling can be performed with low energy, and thus the surfaces of both end portions of the free magnetic layer are less damaged by ion milling, thereby maintaining the magnetic characteristics of both end portions of the free magnetic layer in a good state. In the present invention, ferromagnetic coupling produced between both end portions of the free magnetic layer and the ferromagnetic layers formed thereon can thus be increased, thereby permitting appropriate control of the magnetization of the free magnetic layer.

In the present invention, the specular layer is formed by using an oxide or nitride comprising at least one element of Cr, Mo, W, Ti, Si, Ge and Al to impart the function as the anti-oxidation layer to the specular layer even when the specular layer has a thickness of as small as 3 Å to 15 Å without the nonmagnetic layer. As a result, the total thickness of the layers formed on the free magnetic layer can be properly decreased, and thus both end portions of the free magnetic layer are not damaged by ion milling, thereby permitting effective control of the magnetization of the free magnetic layer.

As described above, in the present invention, it is possible to manufacture a magnetic sensing element capable of effectively controlling the magnetization of a free magnetic layer and appropriately complying with a narrower tack, as compared with a conventional magnetic sensing element.

What is claimed is:

1. A magnetic sensing element comprising:
   a first antiferromagnetic layer, a pinned magnetic layer, a nonmagnetic material layer, and a free magnetic layer, which are laminated in that order;
   a specular layer and a non magnetic layer provided, in that order, on a central portion of the free magnetic layer; and
   a ferromagnetic layer and a second antiferromagnetic layer provided, in that order, on each end portion of the free magnetic layer in a track width direction,
   wherein a total thickness of the layers formed on the central portion of the free magnetic layer is at most 20 Å.

2. A magnetic sensing element according to claim 1, wherein a thickness of the specular layer provided on the central portion of the free magnetic layer is 3 Å to 10 Å.

3. A magnetic sensing element according to claim 2, wherein the specular layer is composed of one of an oxide and nitride comprising at least one element selected from the group consisting of Ti, Zr, Hf, V, Nb, Ta, Al, Si, Ge, Cr, Mo, W, and the rare earth elements.

4. A magnetic sensing element according to claim 3, wherein the nonmagnetic layer comprises at least one element selected from the group consisting of Ru, Rh, Pd, Ir, Os, Re, Cr, Cu, Pt, and Au.

5. A magnetic sensing element according to claim 2, wherein the nonmagnetic layer comprises at least one element selected from the group consisting of Ru, Rh, Pd, Ir, Os, Re, Cr, Cu, Pt, and Au.

6. A magnetic sensing element according to claim 1, wherein the specular layer is composed of one of an oxide and nitride comprising at least one element selected from the group consisting of Ti, Zr, Hf, V, Nb, Ta, Al, Si, Ge, Cr, Mo, W, and the rare earth elements.

7. A magnetic sensing element according to claim 6, wherein the nonmagnetic layer comprises at least one element selected from the group consisting of Ru, Rh, Pd, Ir, Os, Re, Cr, Cu, Pt, and Au.

8. A magnetic sensing element according to claim 1, wherein the nonmagnetic layer comprises at least one element selected from the group consisting of Ru, Rh, Pd, Ir, Os, Re, Cr, Cu, Pt, and Au.

9. A magnetic sensing element according to claim 1, further comprising a backed layer formed between the specular layer and the central portion of the free magnetic layer.

10. A magnetic sensing element according to claim 9, wherein the backed layer is formed on each end portion of the free magnetic layer, and the ferromagnetic layer is formed on the backed layer on each of both end portions.

11. A magnetic sensing element according to claim 10, wherein a thickness of the backed layer formed on each end portion of the free magnetic layer is 0.2 Å to 3 Å.

12. A magnetic sensing element according to claim 9, wherein the specular layer is formed on each end portion of the free magnetic layer, and the ferromagnetic layer is formed on the specular layer on each end portion of the free magnetic layer.

13. A magnetic sensing element according to claim 1, wherein a thickness of the specular layer formed on each end portion of the free magnetic layer is 0.2 Å to 3 Å.

14. A magnetic sensing element according to claim 1, wherein the ferromagnetic layer on each end portion of the nonmagnetic layer has a thickness of 2 Å to 50 Å.

15. A magnetic sensing element according to claim 1, wherein the free magnetic layer is formed in a structure comprising three magnetic layers.

16. A magnetic sensing element according to claim 15, wherein the structure of the free magnetic layer is a three-layer structure of CoFe/NiFe/CoFe.

17. A magnetic sensing element comprising:
a first antiferromagnetic layer, a pinned magnetic layer, a nonmagnetic material layer, and a free magnetic layer, which are laminated in that order:
a specular layer provided on a central portion of the free magnetic layer; and
a ferromagnetic layer and a second antiferromagnetic layer, which are provided, in that order, on each end portion of the free magnetic layer in a track width direction;
wherein a thickness of the specular layer provided on the central portion of the free magnetic layer is 3 Å to 15 Å and a total thickness of the layers formed on the central portion of the free magnetic layer is at most 20 Å.

18. A magnetic sensing element according to claim 17, wherein the specular layer is composed of one of an oxide and nitride comprising at least one element selected from the group consisting of Cr, Mo, W, Ti, Si, Ge and Al.

19. A magnetic sensing element according to claim 17, further comprising a backed layer between the specular layer and the central portion of the free magnetic layer.

20. A magnetic sensing element according to claim 19, wherein the backed layer is formed on each end portion of the free magnetic layer, and the ferromagnetic layer is formed on the backed layer on each end portion of the free magnetic layer.

21. A magnetic sensing element according to claim 20, wherein a thickness of the backed layer formed on each end portion of the free magnetic layer is 0.2 Å to 3 Å.

22. A magnetic sensing element according to claim 17, wherein the specular layer is formed on each end portion of the free magnetic layer, and the ferromagnetic layer is formed on the specular layer on each end portion of the free magnetic layer.

23. A magnetic sensing element according to claim 22, wherein a thickness of the specular layer formed on each end portion of the free magnetic layer is 0.2 Å to 3 Å.

24. A magnetic sensing element according to claim 17, wherein the ferromagnetic layer on each end portion of the nonmagnetic layer has a thickness of 2 Å to 50 Å.

25. A magnetic sensing element according to claim 17, wherein the free magnetic layer is formed in a structure comprising three magnetic layers.

26. A magnetic sensing element according to claim 25, wherein the structure of the free magnetic layer is a three-layer structure of CoFe/NiFe/CoFe.

27. A magnetic sensing element comprising:
a first antiferromagnetic layer, a pinned magnetic layer, a nonmagnetic material layer, and a free magnetic layer, which are laminated in that order;
a specular layer provided on a central portion of the free magnetic layer; and
a ferromagnetic layer and a second antiferromagnetic layer, which are provided, in that order, on each end portion of the free magnetic layer in a track width direction;
wherein the specular layer is composed of one of an oxide and nitride comprising at least one element selected from the group consisting of Cr, Mo, W, Ti, Si, Ge, and Al.

28. A magnetic sensing element according to claim 27, wherein a thickness of the specular layer provided on the central portion of the free magnetic layer is 3 Å to 15 Å.

29. A magnetic sensing element according to claim 27, wherein a total thickness of the layers formed on the central portion of the free magnetic layer is at most 20 Å.

30. A magnetic sensing element according to claim 27, further comprising a backed layer between the specular layer and the central portion of the free magnetic layer.

31. A magnetic sensing element according to claim 30, wherein the backed layer is formed on each end portion of the free magnetic layer, and the ferromagnetic layer is formed on the backed layer on each end portion of the free magnetic layer.

32. A magnetic sensing element according to claim 31, wherein a thickness of the backed layer formed on each end portion of the free magnetic layer is 0.2 Å to 3 Å.

33. A magnetic sensing element according to claim 27, wherein the specular layer is formed on each end portion of the free magnetic layer, and the ferromagnetic layer is formed on the specular layer on each end portion of the free magnetic layer.

34. A magnetic sensing element according to claim 33, wherein a thickness of the specular layer formed on each end portion of the free magnetic layer is 0.2 Å to 3 Å.

35. A magnetic sensing element according to claim 27, wherein the ferromagnetic layer on each end portion of the nonmagnetic layer has a thickness of 2 Å to 50 Å.

36. A magnetic sensing element according to claim 27, wherein the free magnetic layer is formed in a structure comprising three magnetic layers.

37. A magnetic sensing element according to claim 36, wherein the structure of the free magnetic layer is a three-layer structure of CoFe/NiFe/CoFe.

38. A magnetic sensing element comprising:
a first antiferromagnetic layer, a pinned magnetic layer, a nonmagnetic material layer, and a free magnetic layer, which are laminated in that order;
a specular layer and a non magnetic layer provided, in that order, on a central portion of the free magnetic layer;
a ferromagnetic layer and a second antiferromagnetic layer provided, in that order, on each end portion of the free magnetic layer in a track width direction; and
a backed layer formed between the specular layer and the central portion of the free magnetic layer,
wherein the backed layer is formed on each end portion of the free magnetic layer, and the ferromagnetic layer is formed on the backed layer on each of both end portions and a thickness of the backed layer formed on each end portion of the free magnetic layer is 0.2 Å to 3 Å.

39. A magnetic sensing element comprising:
a first antiferromagnetic layer, a pinned magnetic layer, a nonmagnetic material layer, and a free magnetic layer, which are laminated in that order;
a specular layer and a non magnetic layer provided, in that order, on a central portion of the free magnetic layer; and
a ferromagnetic layer and a second antiferromagnetic layer provided, in that order, on each end portion of the free magnetic layer in a track width direction,
wherein a thickness of the specular layer formed on each end portion of the free magnetic layer is 0.2 Å to 3 Å.

40. A magnetic sensing element comprising:
a first antiferromagnetic layer, a pinned magnetic layer, a nonmagnetic material layer, and a free magnetic layer, which are laminated in that order:
a specular layer provided on a central portion of the free magnetic layer;
a ferromagnetic layer and a second antiferromagnetic layer, which are provided, in that order, on each end portion of the free magnetic layer in a track width direction; and a backed layer between the specular layer and the central portion of the free magnetic layer, wherein a thickness of the specular layer provided on the central portion of the free magnetic layer is 3 Å to 15 Å, the backed layer is formed on each end portion of the free magnetic layer, and the ferromagnetic layer is formed on the backed layer on each end portion of the free magnetic layer and a thickness of the backed layer formed on each end portion of the free magnetic layer is 0.2 Å to 3 Å.

41. A magnetic sensing element comprising:

a first antiferromagnetic layer, a pinned magnetic layer, a nonmagnetic material layer, and a free magnetic layer, which are laminated in that order:

a specular layer provided on a central portion of the free magnetic layer; and a ferromagnetic layer and a second antiferromagnetic layer, which are provided, in that order, on each end portion of the free magnetic layer in a track width direction;

wherein the specular layer is formed on each end portion of the free magnetic layer, the ferromagnetic layer is formed on the specular layer on each end portion of the free magnetic layer, a thickness of the specular layer provided on the central portion of the free magnetic layer is 3 Å to 15 Å, and a thickness of the specular layer formed on each end portion of the free magnetic layer is 0.2 Å to 3 Å.

* * * * *